United States Patent
Shoji

(10) Patent No.: US 7,444,872 B2
(45) Date of Patent: *Nov. 4, 2008

(54) ACCELERATION SENSOR AND MAGNETIC DISK DRIVE APPARATUS

(75) Inventor: Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 2 days.

This patent is subject to a terminal disclaimer.

(21) Appl. No.: 11/668,202

(22) Filed: Jan. 29, 2007

(65) Prior Publication Data

US 2007/0186654 A1 Aug. 16, 2007

(30) Foreign Application Priority Data

Feb. 16, 2006 (JP) .................... 2006-039192

(51) Int. Cl.
*G01P 15/11* (2006.01)
(52) U.S. Cl. .................................. 73/514.31
(58) Field of Classification Search ......... 73/514.31, 73/514.29, 514.16, 514.01, 514.35
See application file for complete search history.

(56) References Cited

U.S. PATENT DOCUMENTS

| 3,340,738 | A | * | 9/1967 | Chass .................. 73/514.31 |
| 4,967,598 | A | * | 11/1990 | Wakatsuki et al. ........ 73/514.12 |
| 5,177,370 | A | * | 1/1993 | Meister .................. 307/10.1 |
| 5,400,654 | A | * | 3/1995 | Kaiser et al. ............. 73/514.31 |
| 5,747,991 | A | | 5/1998 | Ito et al. |
| 6,131,457 | A | * | 10/2000 | Sato .................. 73/514.31 |
| 7,219,549 | B2 | * | 5/2007 | Honkura et al. ......... 73/514.31 |
| 2006/0101911 | A1 | | 5/2006 | Shoji |
| 2007/0017290 | A1 | | 1/2007 | Shoji |
| 2007/0019324 | A1 | | 1/2007 | Shoji |
| 2007/0030600 | A1 | | 2/2007 | Shoji |

FOREIGN PATENT DOCUMENTS

JP 2-248867 10/1990

OTHER PUBLICATIONS

U.S. Appl. No. 11/549,820, filed Oct. 16, 2006, Shoji.
U.S. Appl. No. 11/549,768, filed Oct. 16, 2006, Shoji et al.
U.S. Appl. No. 11/623,949, filed Jan. 17, 2007, Shoji.
U.S. Appl. No. 11/668,202, filed Jan. 29, 2007, Shoji.

* cited by examiner

*Primary Examiner*—Helen C. Kwok
(74) *Attorney, Agent, or Firm*—Oblon, Spivak, McClelland, Maier & Neustadt, P.C.

(57) ABSTRACT

An acceleration sensor includes at least one permanent magnet, a spring member for supporting the at least one permanent magnet to displace the at least one permanent magnet when an external force is applied, and a magnetic field detection sensor mounted in stationary state to face the at least one permanent magnet. The magnetic field detection sensor has at least one multi-layered MR element that includes a magnetization fixed layer and a magnetization free layer. The magnetization fixed layer is magnetized in a direction parallel to a displacement detection direction. Each permanent magnet has a multi-layered structure of hard magnetic material layers and nonmagnetic material layers alternately laminated each other in a direction perpendicular to a plane of the magnetic field detection sensor and to the magnetized direction of the magnetization fixed layer.

20 Claims, 27 Drawing Sheets

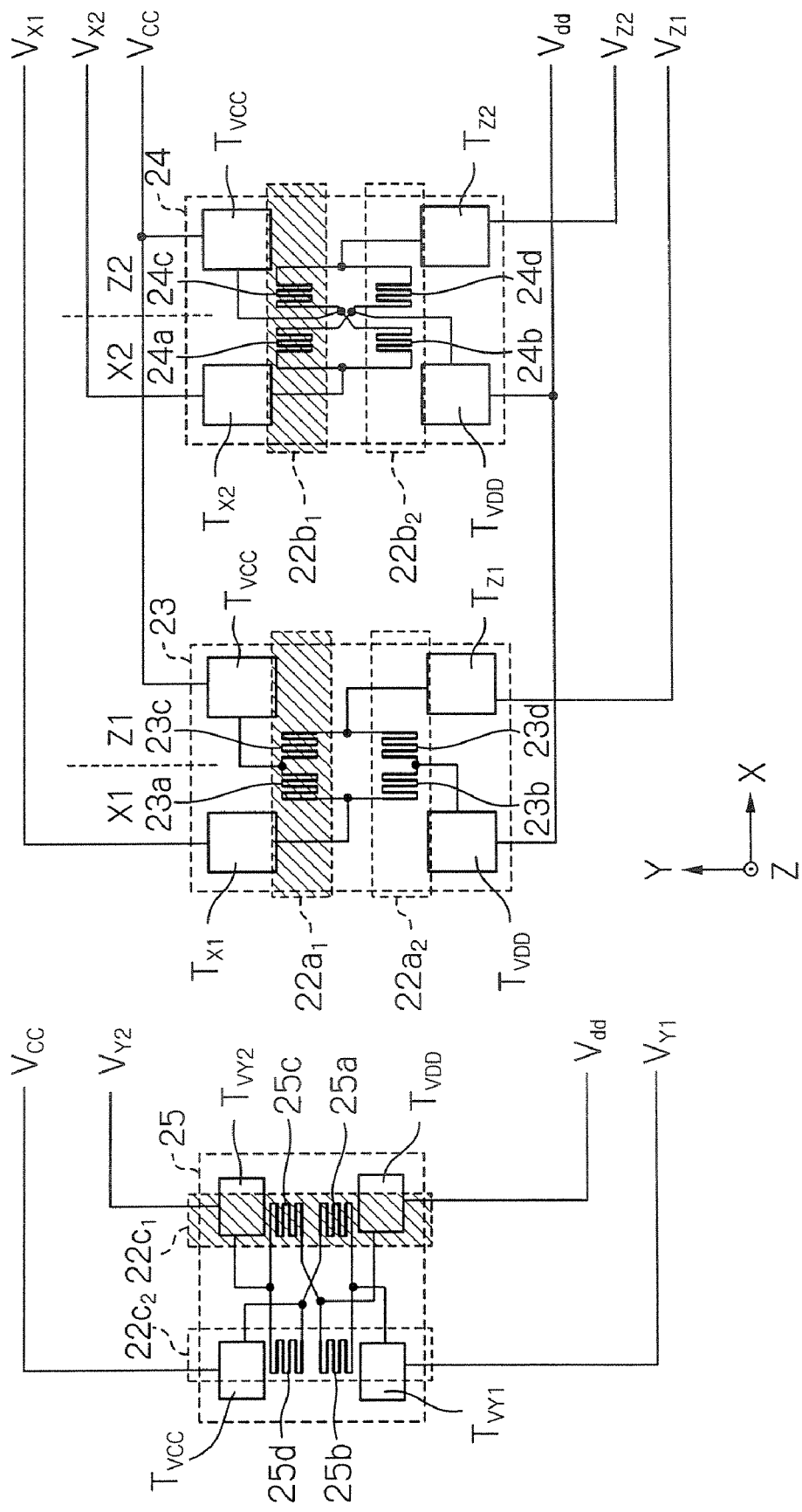

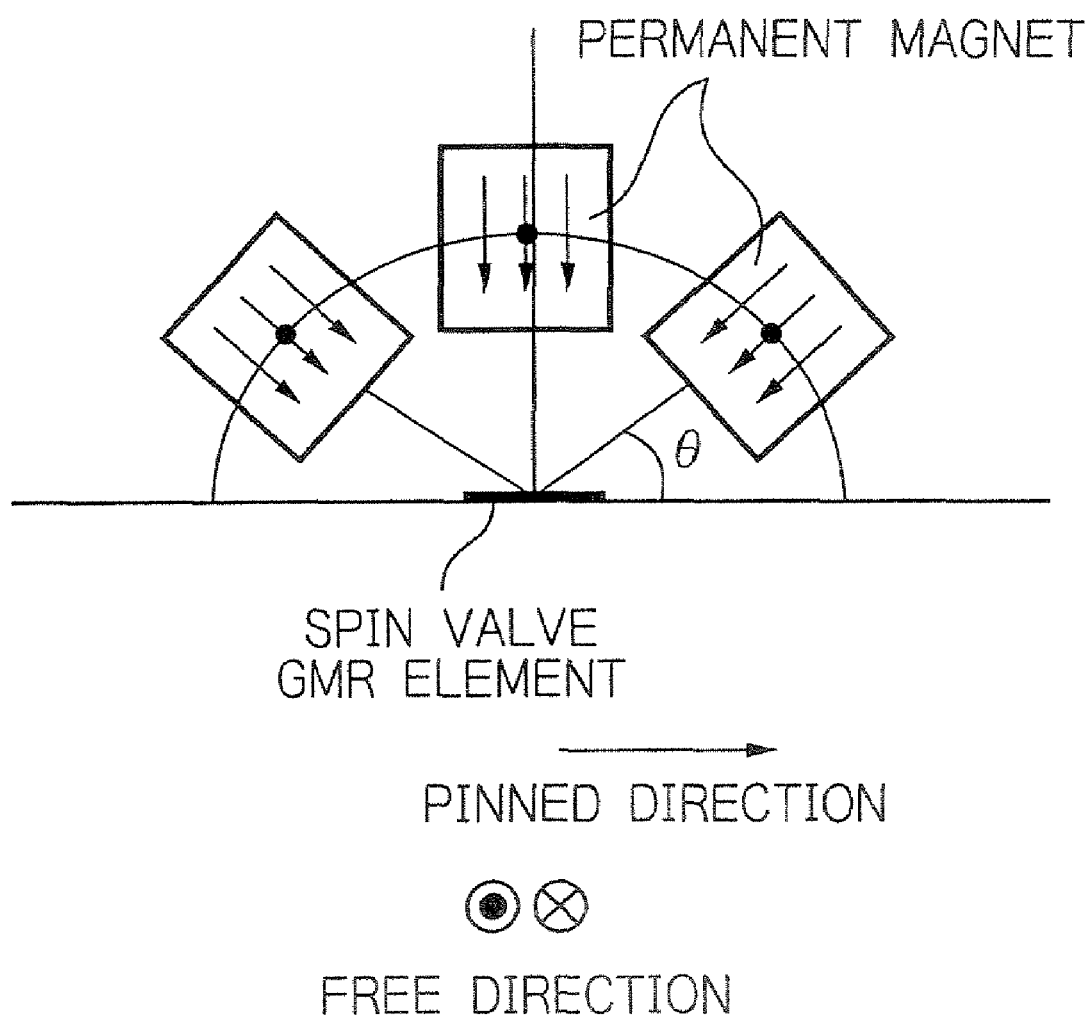

MAGNETIC FIELD COMPONENT IN PINNED DIRECTION

MAGNETIC FIELD COMPONENT IN FREE DIRECTION

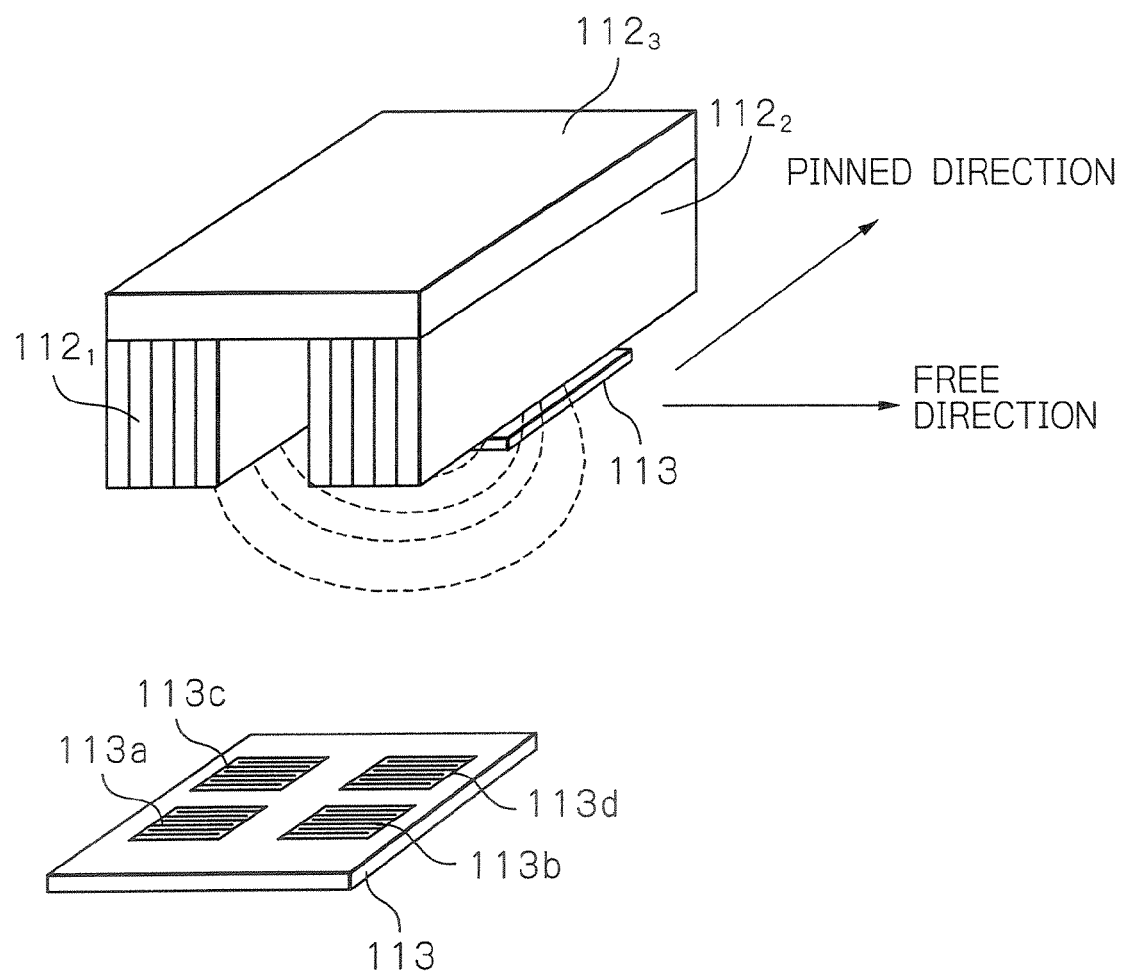

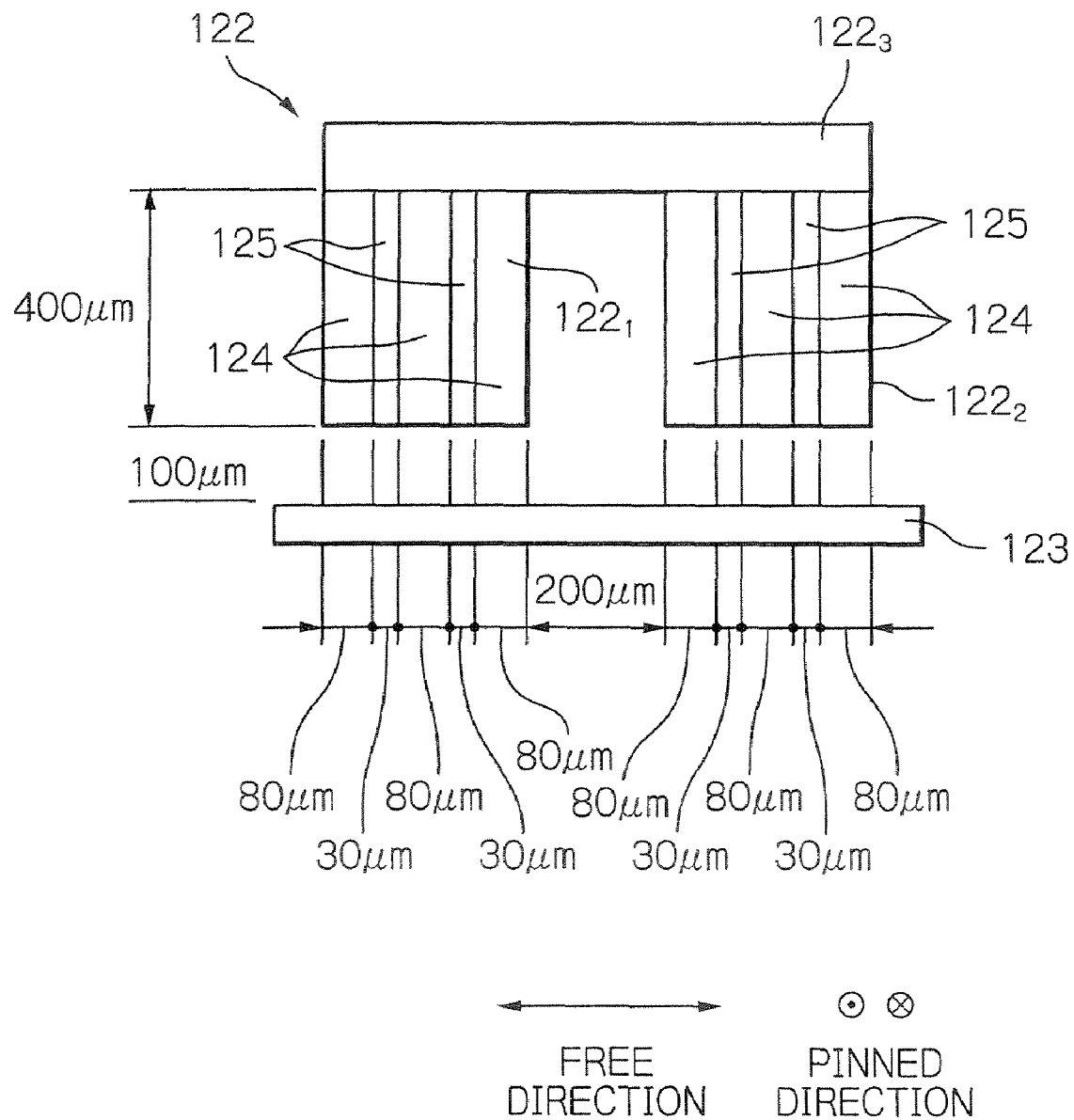

FREE DIRECTION POSITION X (μm)

PINNED DIRECTION POSITION Y (μm)

SPIN VALVE GMR ELEMENT

PERMANENT MAGNET (S-POLE)

PERMANENT MAGNET (N-POLE)

PERMANENT MAGNET

SPIN VALVE GMR ELEMENT

Fig. 14b

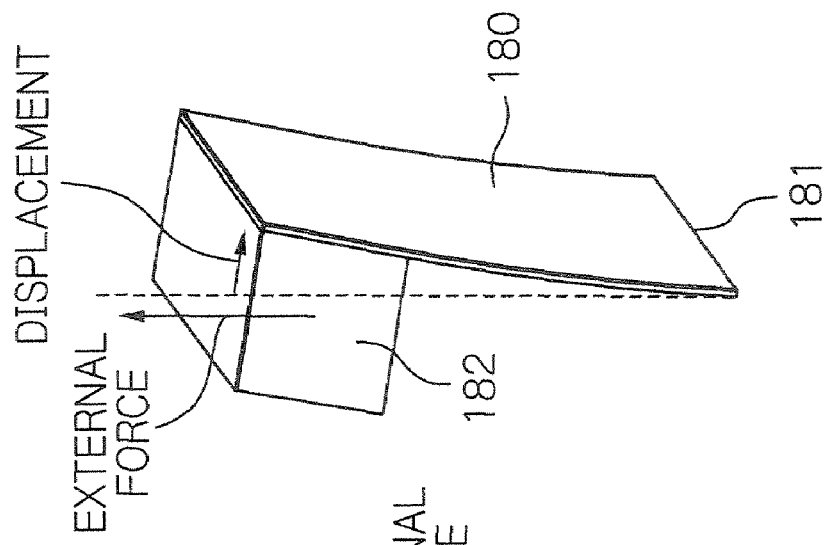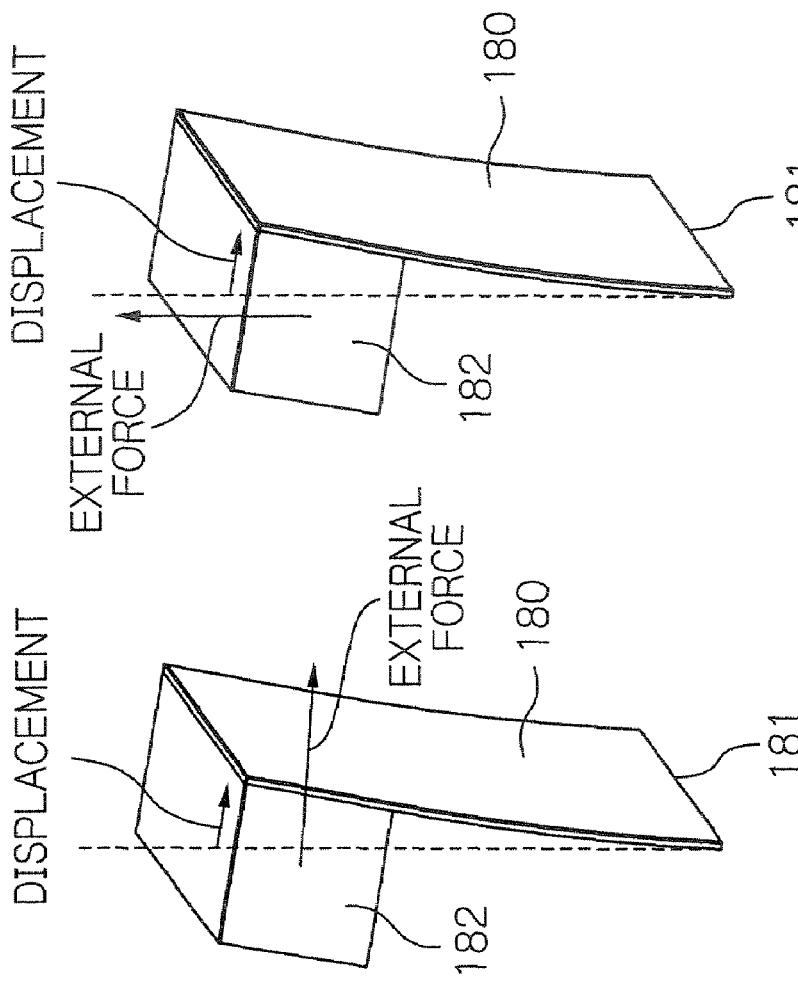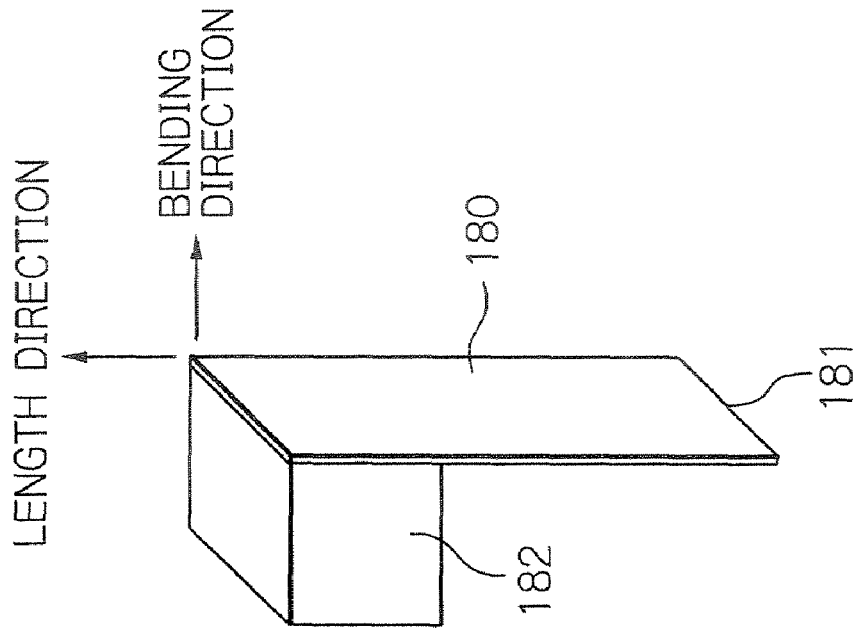

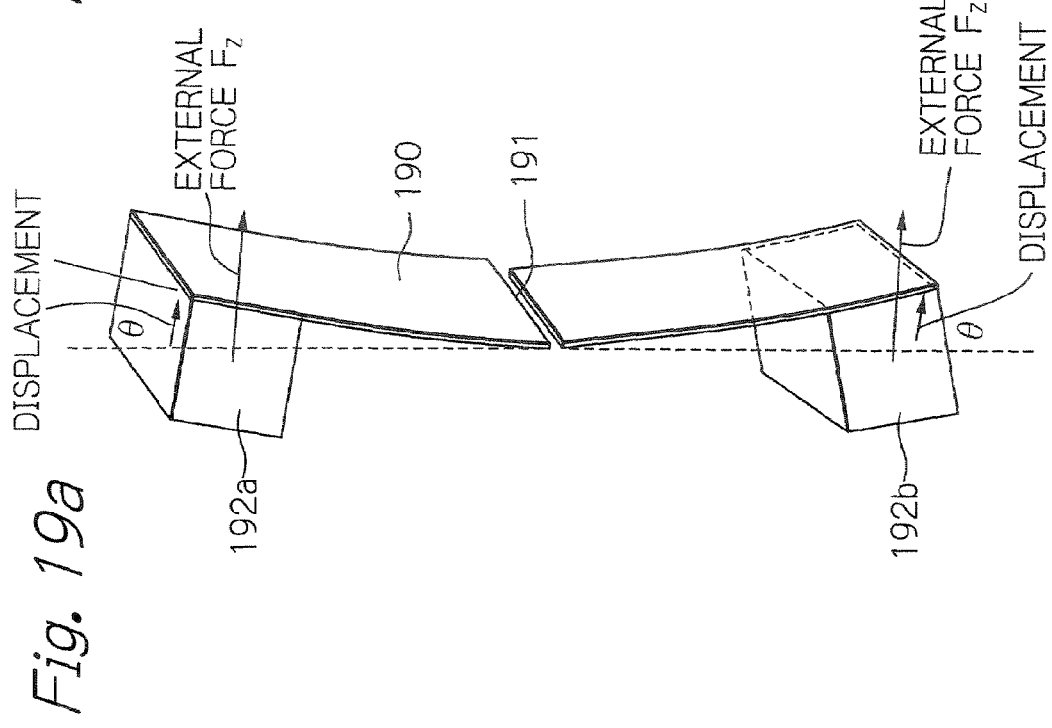

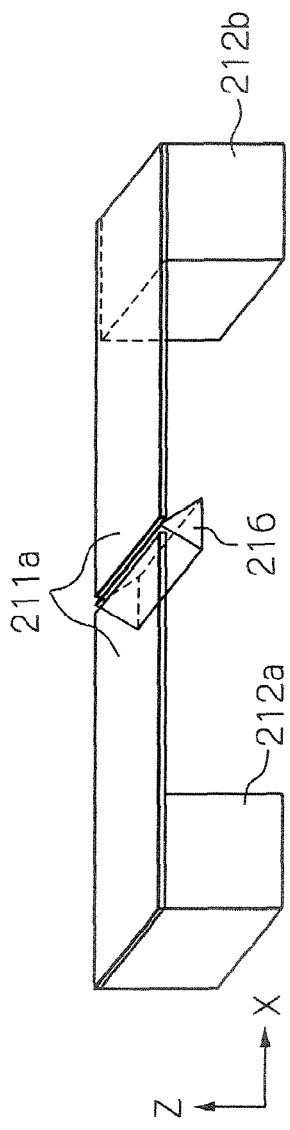
Fig. 26a
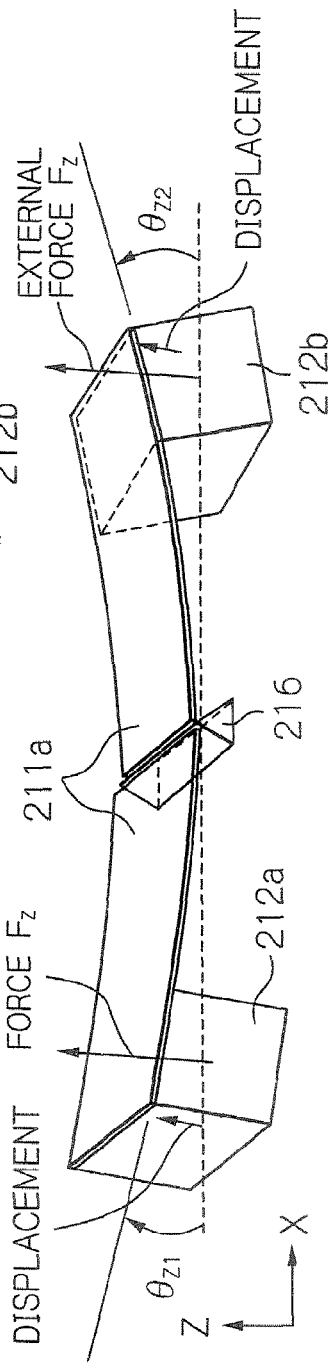
Fig. 26b
Fig. 26c

ACCELERATION SENSOR AND MAGNETIC DISK DRIVE APPARATUS

PRIORITY CLAIM

This application claims priority from Japanese patent application No. 2006-039192, filed on Feb. 16, 2006, which is incorporated herein by reference.

BACKGROUND OF THE INVENTION

1. Field of the Invention

The present invention relates to an acceleration sensor using multi-layered magnetoresistive effect (MR) elements, which can be utilized for detecting movement of a mobile equipment or for detecting movement of a device or equipment that is supposed to move, and to a magnetic disk drive apparatus with the acceleration sensor.

2. Description of the Related Art

In a magnetic disk drive apparatus or a hard disk drive (HDD) apparatus assembled in a mobile equipment such as for example a walkabout personal computer, a mobile phone, a digital audio player and other mobile gear, an HDD apparatus used as a mobile storage itself or a removable HDD apparatus, in order to prevent a collision of a magnetic head with a hard disk surface due to drop impact, it is necessary to detect the instant at which the HDD apparatus is falling before occurrence of the drop impact and to retract the magnetic head from the hard disk surface. Such instant of the falling can be detected from a slight change in the acceleration of gravity.

Japanese patent publication No. 02-248867A discloses a piezo-electric type acceleration sensor for detecting a small change in the acceleration of gravity from a change in stress of springs. This sensor has springs in dual tuning fork vibrators, a weight supported by the springs, and piezo-electric elements attached on the springs to detect the change in stress applied to the springs from the weight.

U.S. Pat. No. 5,747,991 discloses an electrostatic capacitance type acceleration sensor for detecting a small change in the acceleration of gravity from a displacement of a weight. This sensor disclosed in U.S. Pat. No. 5,747,991 has a movable electrode and a static electrode facing each other to detect a change in electrostatic capacitance from a change in distance between the movable and static electrodes due to the acceleration.

Such known piezo-electric type acceleration sensor or electrostatic capacitance type acceleration sensor needs to have electrodes for extracting detection signals there from on the spring or the weight attached to the spring, and also lead lines electrically connected to the electrodes. Thus, the structure of the sensor becomes complicated due to the lead lines connected to the electrodes. Also, in case that the spring and weight are miniaturized, the lead lines formed on the miniaturized spring or weight may induce breakage of the lead lines when an excessive value of impact is applied, and prevent movement of the spring to interface with the improvement in sensitivity of the sensor. This tendency becomes more pronounced as the acceleration sensor becomes smaller.

U.S. Pat. No. 6,131,457 discloses an acceleration sensor that may solve the above-mentioned problems in the conventional piezo-electric type acceleration sensor and electrostatic capacitance type acceleration sensor. This acceleration sensor has a permanent magnet including a mass point on an axis along a Z-axis, mounted to a vibrator supported by four stays capable of elastic deformation such as twisting and bending to have three-dimensional freedom, and four or more MR detector elements positioned on an X-axis and a Y-axis with their centers located along a perimeter of a concentric circle around the origin point of the orthogonal coordinate axes. The sensor is thus capable of detecting each of acceleration in the direction of X-axis through a relative difference in output voltage between the two detector elements on the X-axis due to a vibration of the magnetic field from the magnet, acceleration in the direction of Y-axis through a relative difference in output voltage between the two detector elements on the Y-axis due to a vibration of the magnetic field from the magnet, and acceleration in the direction of Z-axis through a sum total of the output voltages of all the detector elements.

According to the acceleration sensor disclosed in U.S. Pat. No. 6,131,457, as it is not necessary to form electrodes on the spring or the weight, the structure of the sensor becomes simple. However, in such acceleration sensor, with the miniaturization of the magnet, intensity of the magnetic field generated there from weakens, and also with the increase in distance between the magnet and the MR detector element, sensitivity in acceleration detection lowers due to divergence of the magnetic field from the magnet. Furthermore, due to the miniaturization of the magnet and the large leakage of the diverged magnetic field, this acceleration sensor is susceptible to external magnetic filed applied there to, for example, the magnet itself may move in response to the external magnetic filed. Also, using of an anisotropic MR (AMR) element causes lower sensitivity of the magnetic field, so that it is difficult to provide a highly sensitive acceleration sensor.

In order to overcome the aforementioned problems of the conventional acceleration sensors, the inventor of this application has been already proposed an acceleration sensor configured such that a closed-loop magnetic field is provided from a pair of permanent magnets fixed to a spring member and that the magnetic field is applied to a giant magnetoresistive effect (GMR) element (U.S. patent Ser. No. 11/453,090, filed on Jun. 15, 2006). This proposed acceleration sensor has enough insensitivity to external magnetic field applied and high sensitivity in acceleration detection.

However, according to this proposed acceleration sensor, when no external force is applied thereto, a magnetic field component in a direction to be detected, that is in the magnetization direction of the magnetization fixed layer of the GMR element (hereinafter called as pinned direction), among magnetic fields applied to the GMR element from the permanent magnets has a pinned-direction distribution with relatively large changes causing the sensitivity to lower and linearity in its output to deteriorate.

Also, when a magnetic field component in a direction of the magnetization direction of the magnetization free layer of the GMR element (hereinafter called as free direction), that is a direction other than the pinned direction, increases due to receiving of an external force, the magnetic field applied to the free layer may invert causing noise output of the GMR element to produce. Such noise output is another axis signal in a direction other than the pinned direction to be detected and will deteriorate the linearity in the acceleration sensor output with respect to the external force.

SUMMARY OF THE INVENTION

It is therefore an object of the present invention to provide an acceleration sensor and a magnetic disk drive apparatus with the acceleration sensor, whereby highly sensitive detection of acceleration can be expected.

Another object of the present invention is to provide an acceleration sensor and a magnetic disk drive apparatus with the acceleration sensor, whereby good linearity in an output signal with respect to an external force can be expected.

According to the present invention, an acceleration sensor includes at least one permanent magnet, a spring member for supporting the at least one permanent magnet to displace the at least one permanent magnet when an external force is applied, and a magnetic field detection sensor mounted in stationary state to face the at least one permanent magnet. The magnetic field detection sensor has at least one multi-layered MR element that includes a magnetization fixed layer (pinned layer) and a magnetization free layer (free layer). The magnetization fixed layer is magnetized in a direction parallel to a displacement detection direction. Each permanent magnet has a multi-layered structure of hard magnetic material layers and nonmagnetic material layers alternately laminated each other in a direction perpendicular to a plane of the magnetic field detection sensor and to the magnetized direction of the magnetization fixed layer.

Each permanent magnet has the multi-layered structure of hard magnetic material layers and nonmagnetic material layers alternately laminated each other in a direction perpendicular to the film plane of each of the magnetic field detection sensor and to the pinned direction. Thus, it is possible to keep the perpendicular direction component of the magnetic field applied from the permanent magnet highly enough and to keep the free direction component without change. Also, it is possible to decrease the change, along the pinned direction, in the pinned direction component. As a result, high sensitivity and good linearity in detection of external force can be expected.

Also, because it is not necessary to form electrodes on the spring member and the permanent magnet, the wiring structure can be simplified. Further, because the magnetization vector is detected by the magnetic field detection sensor provided with at least one multi-layered MR element including a pinned layer and a free layer, such as for example a GMR element or a tunnel magnetoresistive effect (TMR) element, the amount of and the positive and negative of acceleration in each direction to be detected can be sensed by each magnetic field detection sensor. Therefore, the number of the magnetic field detection sensor can be decreased and also the structure of each magnetic field detection sensor can be extremely simplified resulting the total size of the acceleration sensor to extremely miniaturize. Furthermore, because the GMR element or TMR element is quite sensitive in magnetic field change, highly sensitive acceleration detection can be expected. In addition, because of a low impedance, the acceleration sensor according to the present invention is relatively unaffected by external disturbance when compared with the piezo-electric type acceleration sensor and the electrostatic capacitance type acceleration sensor.

It is preferred that at least one permanent magnet includes a pair of permanent magnets, that each of the pair of permanent magnets has a first surface facing the magnetic field detection sensor, and that the pair of permanent magnets are arranged in parallel so that the first surfaces of the pair of permanent magnets have different magnetic polarities with each other.

It is also preferred that at least one permanent magnet includes a pair of permanent magnets, that each of the pair of permanent magnets has a first surface facing the magnetic field detection sensor and a second surface opposite to the first surface, and that the second surfaces of the pair of permanent magnets are connected to each other by a magnetic material member.

It is further preferred that the hard magnetic material layers of the at least one permanent magnet are made of a ferrite material, and/or that the nonmagnetic material layers of the pair of permanent magnets are made of a nonmagnetic ceramic material.

It is still further preferred that the at least one multi-layered MR element includes a linear portion running along a direction perpendicular to the magnetized direction of the magnetization fixed layer, and a plurality of multi-layered MR layers connected in series. Each multi-layered MR layer has the magnetization fixed layer and the magnetization free layer.

It is further preferred that the spring member includes at least one strip-shaped plate spring with a fulcrum and a support section separated from the fulcrum for supporting the at least one permanent magnet. The at least one strip-shaped plate spring is configured to produce a bending stress in response to the external force applied so as to displace the at least one permanent magnet.

It is preferred that the spring member includes a first strip-shaped plate spring with a fulcrum at its center and two second strip-shaped plate springs having fulcrums at their centers connected both ends of the first strip-shaped plate spring respectively, and that the at least one permanent magnet is attached to each end of each second strip-shaped plate spring.

It is further preferred that the spring member includes a single strip-shaped plate spring having a fulcrum at its center, and that the at least one permanent magnet is attached to each end of the single strip-shaped plate spring.

It is preferred that each multi-layered MR element consists of a GMR element or a TMR element.

According to the present invention, also, a magnetic disk drive apparatus is provided with the aforementioned acceleration sensor.

Further objects and advantages of the present invention will be apparent from the following description of the preferred embodiments of the invention as illustrated in the accompanying drawings.

BRIEF DESCRIPTION OF THE DRAWINGS

FIG. 5 is a circuit diagram schematically illustrating electrical connection structures of the wiring board and the magnetic filed detection sensors in the acceleration sensor shown in FIG. 2;

FIG. 8 is a view illustrating an angle θ of the magnetic field applied;

FIG. 11 is an oblique view illustrating position relationship between permanent magnets and magnetic material member and the spin valve GMR element in the acceleration sensor shown in FIG. 2;

FIG. 12 is a sectional view illustrating structure of each magnetic field generation member with weight shown in FIG. 2;

FIG. 13a is a view illustrating the simulation result of distribution of free direction magnetic field components Hx applied to a magnetic field detection sensor from a pair of permanent magnets in case that each permanent magnet is formed by a single layer of a hard magnetic material;

FIG. 13b is a view illustrating the simulation result of distribution of free direction magnetic field components Hx applied to a magnetic field detection sensor from a pair of permanent magnets in case that each permanent magnet is formed in a multi-layered structure with hard magnetic material layers and nonmagnetic material layers as shown in FIG. 2;

FIG. 14a is a view illustrating the simulation result of distribution of perpendicular direction magnetic field components Hz applied to a magnetic field detection sensor from a pair of permanent magnets in case that each permanent magnet is formed by a single layer of a hard magnetic material;

FIG. 14b is a view illustrating the simulation result of distribution of perpendicular direction magnetic field components Hz applied to a magnetic field detection sensor from a pair of permanent magnets in case that each permanent magnet is formed in a multi-layered structure with hard magnetic material layers and nonmagnetic material layers as shown in FIG. 2;

FIGS. 18a, 18b and 18c are oblique views illustrating fundamental operations of a strip-shaped plate spring of a spring member according to the present invention;

FIGS. 19a and 19b are oblique views illustrating operations of a strip-shaped plate spring having a fulcrum at its center and weight members at its both end sections;

FIGS. 26a, 26b and 26c are oblique views illustrating operations of the spring member shown in FIG. 21.

DESCRIPTION OF THE PREFERRED EMBODIMENTS

Figure 1:
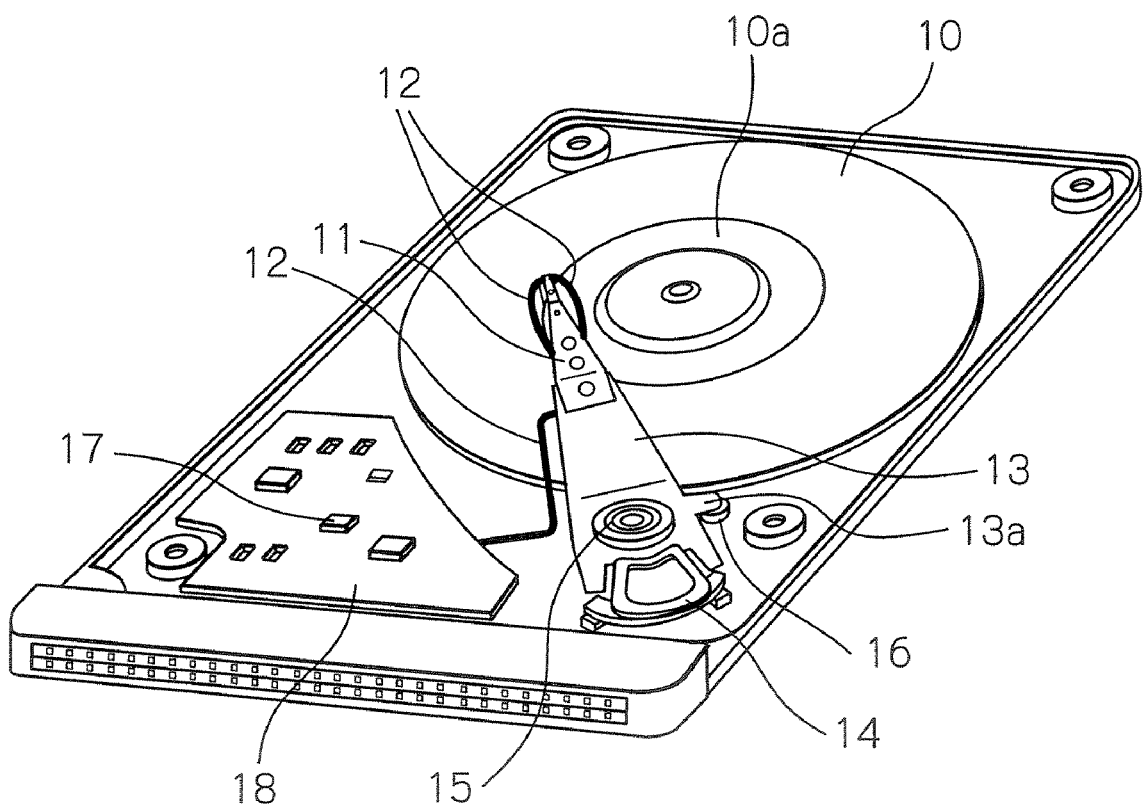
FIG. 1 is an oblique view schematically illustrating a whole structure of an example of a magnetic disk drive apparatus with an acceleration sensor assembled therein.

FIG. 1 schematically illustrates a whole structure of an example of a magnetic disk drive apparatus with an acceleration sensor assembled therein. This magnetic disk drive apparatus is a micro HDD apparatus using at least one magnetic disk of for example 2.5 inches, 1.8 inches, 1.3 inches, or 1.0 or less inches. Such micro HDD apparatus may be an HDD apparatus assembled in mobile equipment such as for example a walkabout personal computer, a mobile phone, a digital audio player or other mobile gear, or an HDD apparatus used itself as a mobile storage or a removable HDD.

In the figure indicating uncovered state of the magnetic disk drive apparatus, reference numeral 10 denotes a magnetic disk rotated by a spindle motor in operation, and 10a denotes a retracted zone of the magnetic disk 10, with no written data. A magnetic head moves into the retracted zone upon detection of drop of the magnetic disk drive apparatus. In the figure, also, reference numeral 11 denotes a head gimbal assembly (HGA). The magnetic head facing to the magnetic disk 10 in operation is attached at the top end section of this HGA 11. Reference numeral 12 denotes a flexible printed circuit (FPC) that is a lead conductor member electrically connected to the magnetic head, 13 denotes a support arm for supporting the HGA 11, 14 denotes a voice coil motor (VCM) that is an actuator for positioning the magnetic head by pivoting the support arm 13 about an axis 15, 16 denotes a ramp on which a tub 13a of the support arm 13 is climbed to lift the magnetic head away from the magnetic disk surface upon detection of drop, and 17 denotes an acceleration sensor mounted on a circuit board 18, respectively.

Figure 2:
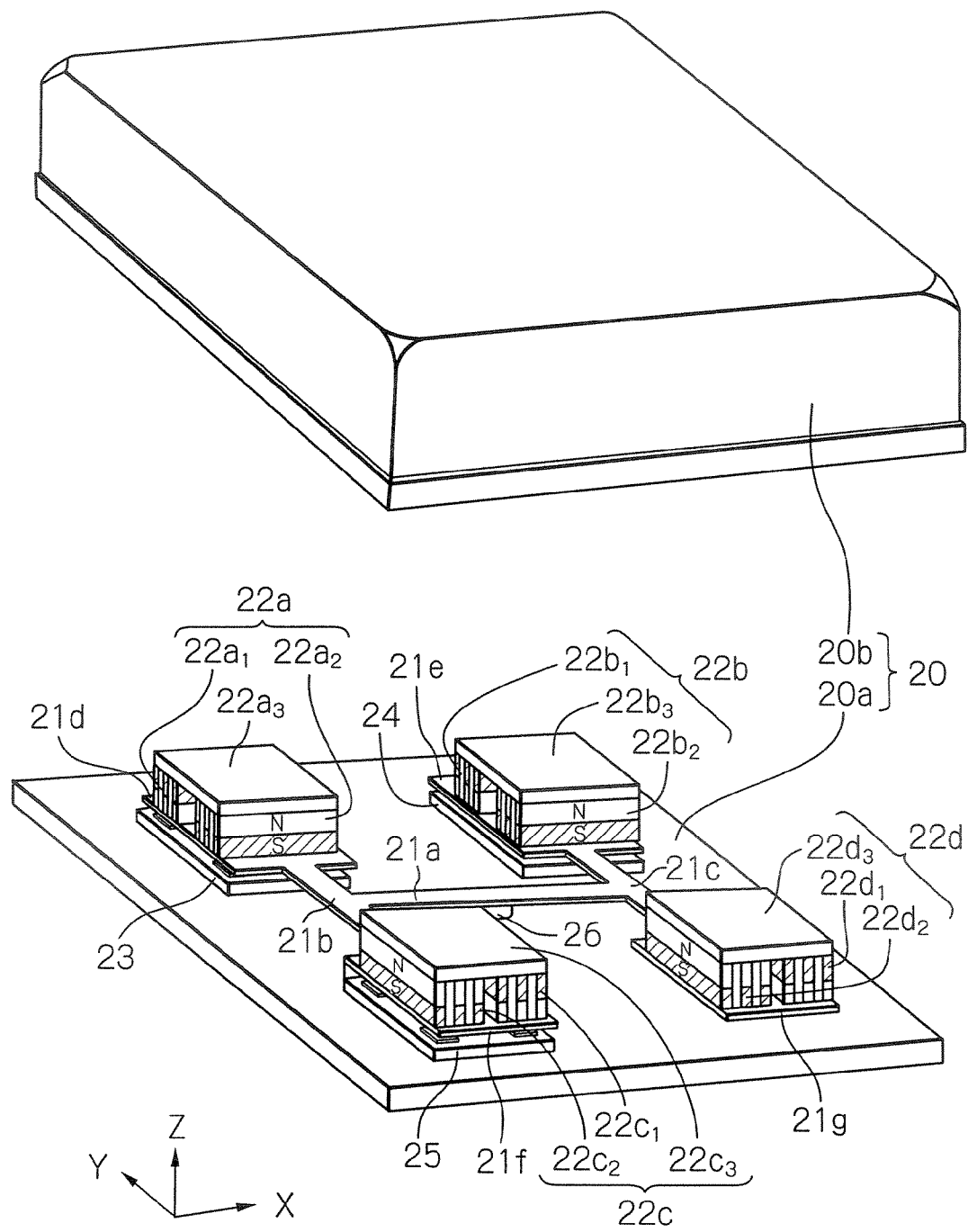
FIG. 2 is an exploded oblique view schematically illustrating a whole structure of an acceleration sensor as a preferred embodiment according to the present invention.
Figure 3:
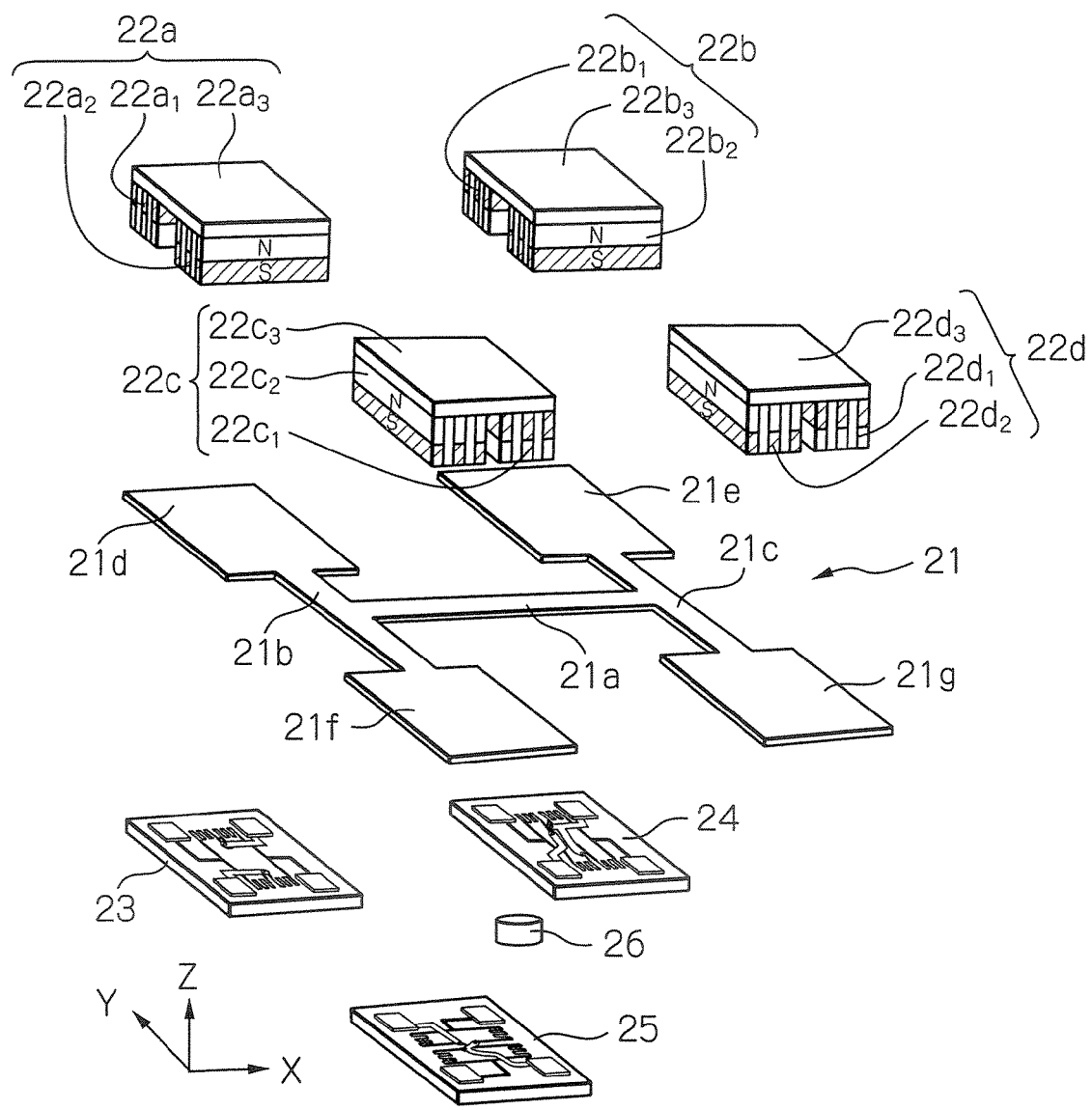
FIG. 3 is an exploded oblique view schematically illustrating structures of a spring member, magnetic field generation members with weights and magnetic filed detection sensors mounted in a housing member of the acceleration sensor shown in FIG. 2.

FIG. 2 schematically illustrates a whole structure of the acceleration sensor 17 as a preferred embodiment according to the present invention, and FIG. 3 illustrates structures of a spring member, magnetic field generation members with weights and magnetic field detection sensors mounted in a housing member of the acceleration sensor.

The acceleration sensor in this embodiment is used for detecting accelerations in three axes of X-axis direction, Y-axis direction and Z-axis direction. The acceleration sensor has a spring member 21, four magnetic field generation members with weights 22a-22d, a first magnetic field detection sensor 23 for detecting the X-axis and the Z-axis accelerations, a second magnetic field detection sensor 24 for detecting the X-axis and the Z-axis accelerations, a third magnetic field detection sensor 25 for detecting the Y-axis acceleration, and a fulcrum member 26, accommodated in the housing member 20. The spring member 21 is integrally formed from a first strip-shaped plate spring 21a, two second strip-shaped plate springs 21b and 21c, and four weight-support sections 21d-21g for supporting the four magnetic field generation members with weights 22a-22d. The four magnetic field generation members with weights 22a-22d have the same constitutions in dimension, in shape and in weight with each other, but directions of length of their permanent magnets are not the same.

The housing member 20 consists of a flat-shaped wiring board 20a with a substrate made of a resin material such as for example polyimide or BT resin and a wiring pattern (not shown) formed on and in the substrate, and a cover member 20b made of a magnetic metal material for covering and for sealing the wiring board 20a. In this embodiment, accelerations along three axes that are in X-axis direction, Y-axis direction and Z-axis direction can be detected by the three magnetic field detection sensors 23-25 mounted on a single plane of the wiring board 20a.

The spring member 21 is integrally formed from a thin-film metal plate made of for example NiFe, Ni or else, from a thin plate made of for example stainless steel, or from a thin resin plate made of for example polyimide, to have a shape shown in FIG. 3.

The first strip-shaped plate spring 21a functions as a main spring, and produces a bending stress and/or a twisting stress in response to an externally applied force. The center of the first strip-shaped plate spring 21a constitutes a fulcrum and is fixed to one end of the fulcrum member 26. The other end of the fulcrum member 26 is fixed to the wiring board 20a. The two second strip-shaped plate springs 21b and 21c function as sub-springs, and produce only a bending stress in response to an externally applied force. The centers of these second strip-shaped plate springs 21b and 21c are unitarily connected to the both ends of the first strip-shaped plate spring 21a, respectively. The both ends of the second strip-shaped plate springs 21b and 21c are unitarily connected to the weight-support sections 21d-21g that have the same shape to each other, respectively. In this embodiment, each of the weight-support sections 21d-21g is shaped in a rectangular. However, in modifications, it may be formed in a circular shape or other shape.

The magnetic field generation members with weights 22a-22d are fixed by an adhesive on one surfaces, that are opposite to the other surfaces faced to the magnetic field detection sensors, of the weight-support sections 21d-21g of the spring member 21, respectively. These magnetic field generation members with weights 22a-22d have four pairs of permanent magnets $22a_1$ and $22a_2$, $22b_1$ and $22b_2$, $22c_1$ and $22c_2$, and $22d_1$ and $22d_2$ for generating magnetic fields, respectively, and magnetic material members for connecting the respective pairs of permanent magnets.

The first magnetic field detection sensor 23 for the X-axis and the Z-axis, the second magnetic field detection sensor 24 for the X-axis and the Z-axis and the third magnetic field detection sensor 25 for the Y-axis are fixed by an adhesive on the wiring board 20a so as to face the three-magnetic field generation members with weights 22a-22c of the four-magnetic field generation members with weights 22a-22d, in other words so as to face the other surfaces of the weight-support sections 21d-21f, respectively. Therefore, magnetic fields with angles that change depending upon the accelerations are applied to the first to third magnetic field detection sensors 23-25 from the magnetic field generation members with weights 22a-22c, respectively. In this embodiment, the magnetic field generation member with weight 22d is provided only for keeping balance of the spring member 21.

Each of the pair of permanent magnets $22a_1$ and $22a_2$ is formed as a multi-layered structure of a ferrite material and a nonmagnetic ceramic material, which structure will be described in detail with reference to FIG. 12 later, and shaped in a rectangular parallelepiped shape running in parallel with each other along the X-axis direction. These permanent magnets $22a_1$ and $22a_2$ face to the first magnetic field detection sensor 23 for the X-axis and the Z-axis. The pair of permanent magnets $22a_1$ and $22a_2$ is arranged so that their one surfaces facing the first magnetic field detection sensor 23 have different magnetic polarities with each other. The other surfaces of the pair of permanent magnets $22a_1$ and $22a_2$ are magnetically connected each other by a magnetic material member $22a_3$ that constitutes a magnetic return path. A closed magnetic loop is formed by these permanent magnets $22a_1$ and $22a_2$ and the magnetic material member $22a_3$. As will be mentioned later, spin valve GMR elements in the first magnetic field detection sensor 23 are arranged within this closed magnetic loop so that a magnetic field or bias field is applied in a direction substantially perpendicular to the lamination plane of these spin valve GMR elements. Particularly, the pair of permanent magnets $22a_1$ and $22a_2$ is arranged such that their longitudinal direction is in parallel with the pinned direction of the spin valve GMR elements 23a and 23c and the spin valve GMR elements 23b and 23d (FIGS. 4 and 5) of the first magnetic field detection sensor 23. Thus, it is possible to reduce possible change, along the pinned direction, in the pinned direction component of the magnetic field applied from each permanent magnet, and therefore high sensitive detection of acceleration can be expected.

Each of the pair of permanent magnets $22b_1$ and $22b_2$ is formed as a multi-layered structure of a ferrite material and a nonmagnetic ceramic material, which structure will be described in detail with reference to FIG. 12 later, and shaped in a rectangular parallelepiped shape running in parallel with each other along the X-axis direction. These permanent magnets $22b_1$ and $22b_2$ face to the second magnetic field detection sensor 24 for the X-axis and the Z-axis. The pair of permanent magnets $22b_1$ and $22b_2$ is arranged so that their surfaces facing the second magnetic field detection sensor 24 have different magnetic polarities with each other. The other surfaces of the pair of permanent magnets $22b_1$ and $22b_2$ are magnetically connected each other by a magnetic material member $22b_3$ that constitutes a magnetic return path. A closed magnetic loop is formed by these permanent magnets $22b_1$ and $22b_2$ and the magnetic material member $22b_3$. As will be mentioned later, spin valve GMR elements in the second magnetic field detection sensor 24 are arranged within this closed magnetic loop so that a magnetic field or bias field is applied in a direction substantially perpendicular to the lamination plane of these spin valve GMR elements. Particularly, the pair of permanent magnets $22b_1$ and $22b_2$ is arranged such that their longitudinal direction is in parallel with the pinned direction of the spin valve GMR elements 24a and 24c and the spin valve GMR elements 24b and 24d (FIGS. 4 and 5) of the second magnetic field detection sensor 24. Thus, it is possible to reduce possible change, along the pinned direction, in the pinned direction component of the magnetic field applied from each permanent magnet, and therefore high sensitive detection of acceleration can be expected.

Each of the pair of permanent magnets $22c_1$ and $22c_2$ is formed as a multi-layered structure of a ferrite material and a nonmagnetic ceramic material, which structure will be described in detail with reference to FIG. 12 later, and shaped in a rectangular parallelepiped shape running in parallel with each other along the Y-axis direction. These permanent magnets $22c_1$ and $22c_2$ face to the third magnetic field detection sensor 25 for the Y-axis. The pair of permanent magnets $22c_1$ and $22c_2$ is arranged so that their surfaces facing the third magnetic field detection sensor 25 have different magnetic polarities with each other. The other surfaces of the pair of permanent magnets $22c_1$ and $22c_2$ are magnetically connected each other by a magnetic material member $22c_3$ that constitutes a magnetic return path. A closed magnetic loop is formed by these permanent magnets $22c_1$ and $22c_2$ and the magnetic material member $22c_3$. As will be mentioned later, spin valve GMR elements in the third magnetic field detection sensor 25 are arranged within this closed magnetic loop so that a magnetic field or bias field is applied in a direction substantially perpendicular to the lamination plane of these spin valve GMR elements. Particularly, the pair of permanent magnets $22c_1$ and $22c_2$ is arranged such that their longitudinal direction is in parallel with the pinned direction of the spin valve GMR elements 25a and 25c and the spin valve GMR elements 25b and 25d (FIGS. 4 and 5) of the third magnetic field detection sensor 25. Thus, it is possible to reduce possible change, along the pinned direction, in the pinned direction component of the magnetic field applied from each permanent magnet, and therefore high sensitive detection of acceleration can be expected.

In this embodiment, as well as that in other pairs of permanent magnets, each of the pair of permanent magnets $22d_1$ and $22d_2$ is formed as a multi-layered structure of a ferrite material and a nonmagnetic ceramic material, which structure will be described in detail with reference to FIG. 12 later, and shaped in a rectangular parallelepiped shape running in parallel with each other along the Y-axis direction. These permanent magnets $22c_1$ and $22c_2$ face to the wiring board 20a at a position with no magnetic field detection sensor. The pair of permanent magnets $22d_1$ and $22d_2$ is arranged so that their surfaces facing the wiring board 20a have different magnetic polarities with each other. The other surfaces of the pair of permanent magnets $22d_1$ and $22d_2$ are magnetically connected each other by a magnetic material member $22d_3$ that constitutes a magnetic return path.

Figure 4:
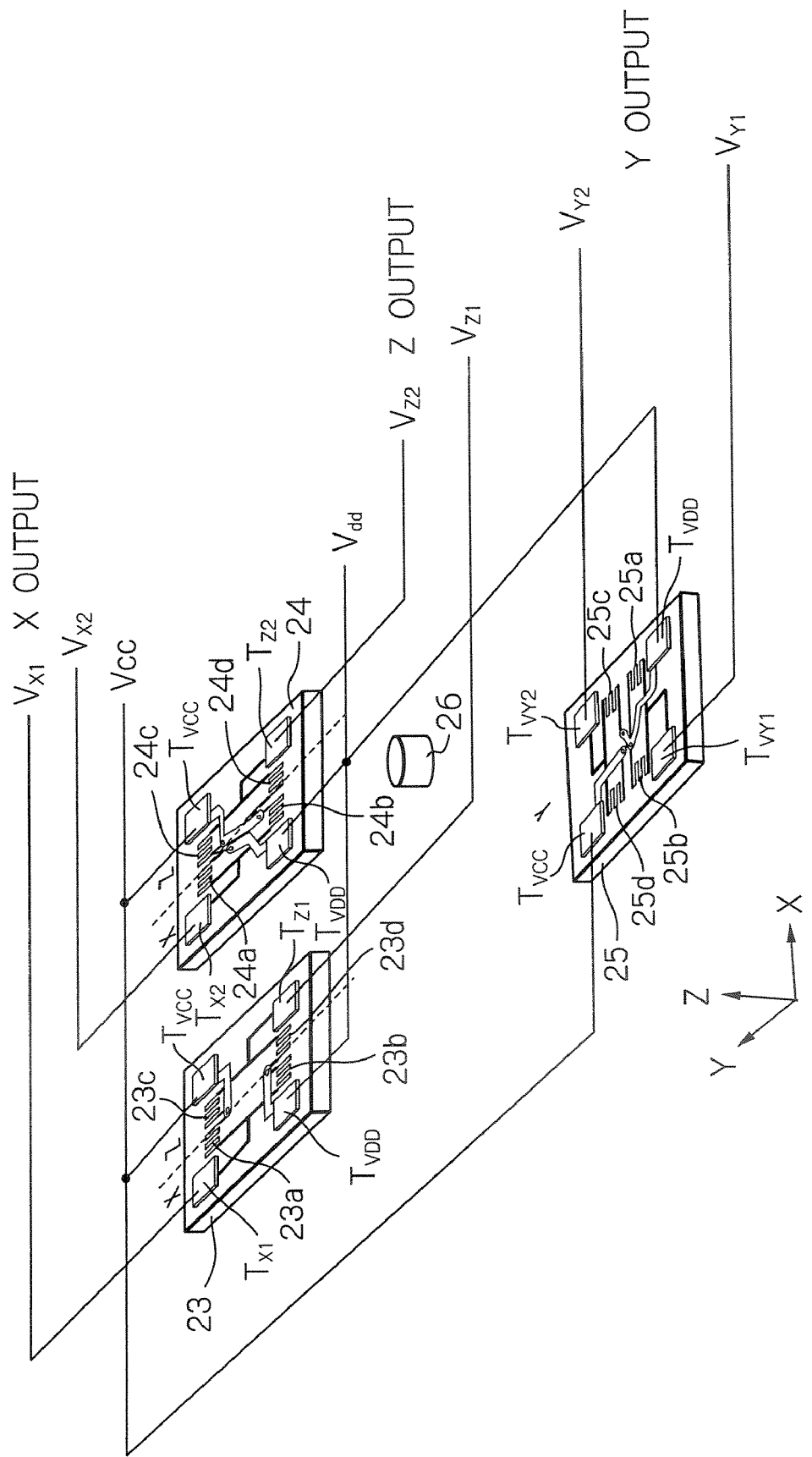
FIG. 4 is a view schematically illustrating electrical connections on a wiring board, and structures of the magnetic filed detection sensors in the acceleration sensor shown in FIG. 2.
Figure 6A:
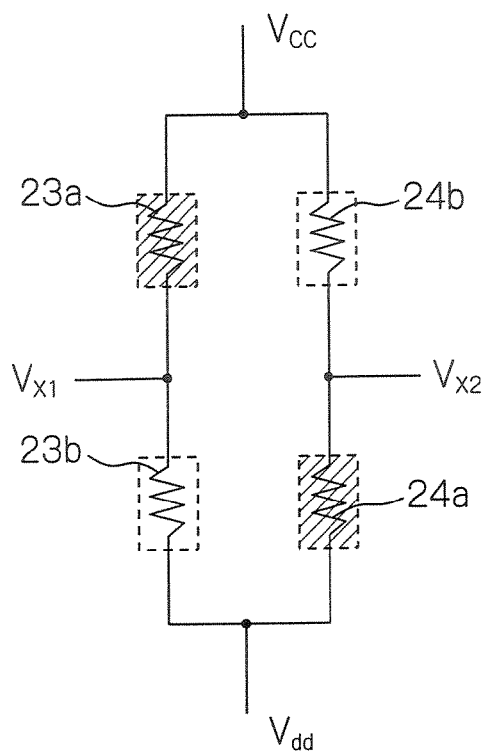
FIGS. 6a, 6b and 6c are equivalent circuit diagrams of the acceleration sensor shown in FIG. 2.
Figure 6B:
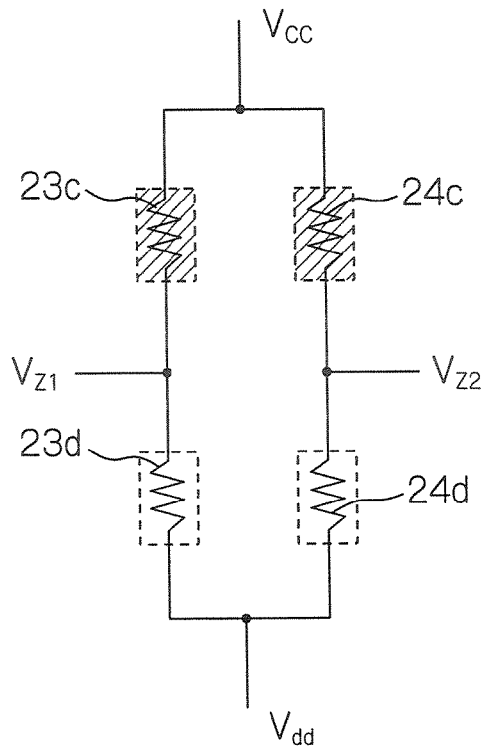
Figure 6C:
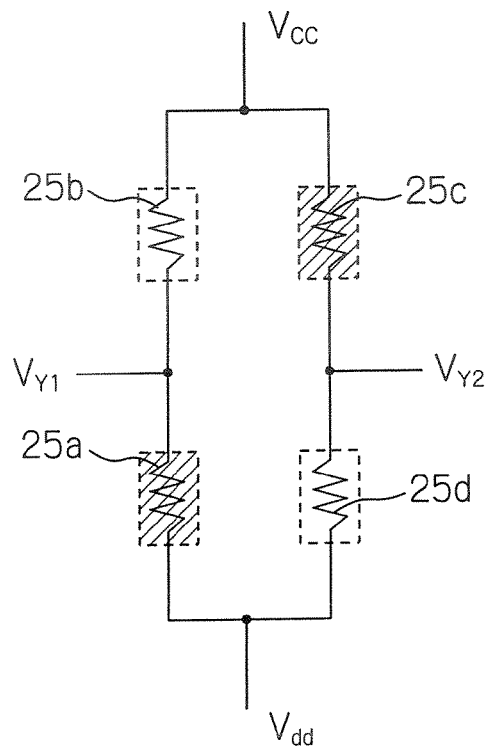

FIG. 4 schematically illustrates electrical connections on the wiring board 20a and structures of the magnetic filed detection sensors 23-25, FIG. 5 illustrates electrical connection structures of the wiring board 20a and the magnetic filed detection sensors 23-25, and FIGS. 6a, 6b and 6c show equivalent circuit diagrams of the acceleration sensor.

As illustrated in these figures, in the first magnetic field detection sensor 23 for detecting accelerations in the X-axis and the Z-axis directions, two pairs of or four spin valve GMR elements 23a, 23b, 23c and 23d are formed in parallel with each other. Each of the spin valve GMR elements 23a to 23d has a linear section running along a direction (Y-axis direction) perpendicular to the X-axis. The spin valve GMR elements 23a and 23b constitute one pair and, in this embodiment, they are connected in series with each other. Both ends of the serially connected elements 23a and 23b are electrically connected to power supply terminal electrodes $T_{VCC}$ and $T_{VDD}$, respectively. The central point between the elements 23a and 23b is electrically connected to a signal output terminal $T_{X1}$. The spin valve GMR elements 23c and 23d also constitute one pair and, in this embodiment, they are connected in series with each other. Both ends of the serially connected elements 23c and 23d are electrically connected to the power supply terminal electrodes $T_{VCC}$ and $T_{VDD}$, respectively. The central point between the elements 23c and 23d is electrically connected to a signal output terminal $T_{Z1}$.

Each of the spin valve GMR elements 23a, 23b, 23c and 23d has a multi-layered structure mainly consisting of a magnetization fixed layer constituted by a pin layer of an anti-ferromagnetic material and a pinned layer of a ferromagnetic material, a nonmagnetic space layer, and a magnetization free layer (free layer) of a ferromagnetic material. The magnetization of the pinned layer of each element is fixed in the same direction (pinned direction) perpendicular to a running direction of the free layer (free direction). Namely, in the first magnetic field detection sensor 23, all the pinned layers of the spin valve GMR elements 23a, 23b, 23c and 23d are fixed in the same direction that is the X-axis direction.

Figure 7:
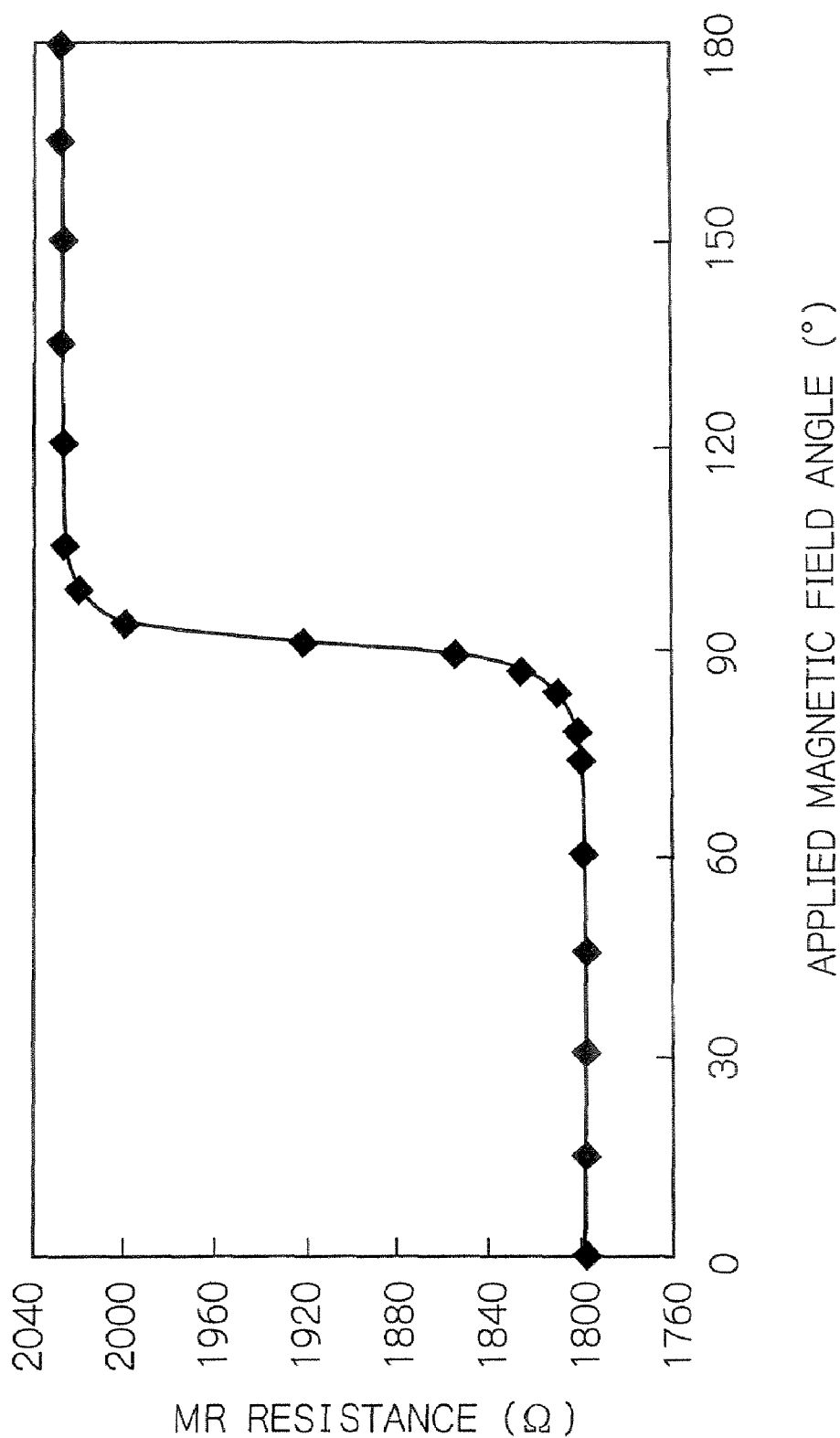
FIG. 7 is a view illustrating characteristics of an MR resistance variation versus an applied magnetic field angle with respect to a lamination plane of a spin valve GMR element.

FIG. 7 illustrates characteristics of the MR resistance variation versus the applied magnetic field angle with respect to the lamination plane of the spin valve GMR element, and FIG. 8 illustrates an angle θ of the magnetic field applied. In FIG. 7, the lateral axis represents an angle θ (degrees) between the applied magnetic field or the bias magnetic field and the pinned direction, and the longitudinal axis represents an MR resistance (Ω). In this illustration, it is assumed that there is no inclination toward the free direction.

As will be noted from FIG. 7, the MR resistance of the spin valve GMR element will greatly change depending upon a slight change near 90 degrees of angle in the bias magnetic field. Because the small angle change θ of the bias magnetic field corresponds to 90 degrees ±θ, the small inclination of the magnetic field generation member with weight, that is, the pair of the permanent magnets is extracted as a change in MR resistance. This change in MR resistance indicates not only the amount of angle change but also positive and negative directions of angle change.

The bias magnetic fields respectively applied to the pair of spin valve GMR elements 23a and 23b connected in series with each other are in the directions substantially opposite to each other. Thus, the magnetization directions of the respective pinned layers in these spin valve GMR elements 23a and 23b are fixed to the same direction. The bias magnetic fields in the directions opposite to each other are obtained because a closed magnetic loop is formed by the pair of permanent magnets $22a_1$ and $22a_2$ and the magnetic material member $22a_3$, and the pair of spin valve GMR elements 23a and 23b are arranged in the respective paths of the closed magnetic loop, through which magnetic fields flow in the directions opposite to each other, as shown in FIG. 5 and as more clearly shown in FIG. 11 described later. In this case, the center of the magnetic circuit that constitutes the closed magnetic loop is located on the centerline between the pair of spin valve GMR elements 23a and 23b.

To the pair of spin valve GMR elements 23c and 23d connected in series with each other, the same bias magnetic fields in the directions substantially opposite to each other are applied and the magnetization directions of the respective pinned layers in these spin valve GMR elements 23c and 23d are fixed to the same direction. In this case, also, the center of the magnetic circuit that constitutes the closed magnetic loop is located on the centerline between the pair of spin valve GMR elements 23c and 23d.

Since the magnetization directions of the respective pinned layers in the pair of spin valve GMR elements 23a and 23b and the pair of spin valve GMR elements 23c and 23d are fixed to the same direction by applying the opposite direction bias magnetic fields thereto, these four spin valve GMR elements 23a, 23b, 23c and 23d can be formed in a single chip resulting the acceleration sensor to more downsize.

In the second magnetic field detection sensor 24 for detecting accelerations in the X-axis and the Z-axis directions, two pairs of or four spin valve GMR elements 24a, 24b, 24c and 24d are also formed in parallel with each other Each of the spin valve GMR elements 24a to 24d has a linear section running along a direction (Y-axis direction) perpendicular to the X-axis. The spin valve GMR elements 24b and 24a constitute one pair and, in this embodiment, they are connected in series with each other. Both ends of the serially connected elements 24b and 24a are electrically connected to power supply terminal electrodes $T_{VCC}$ and $T_{VDD}$, respectively. The central point between the elements 24b and 24a is electrically connected to a signal output terminal $T_{X2}$. The spin valve GMR elements 24c and 24d also constitute one pair and, in this embodiment, they are connected in series with each other. Both ends of the serially connected elements 24c and 24d are electrically connected to the power supply terminal electrodes $T_{VCC}$ and $T_{VDD}$, respectively. The central point between the elements 24c and 24d is electrically connected to a signal output terminal $T_{Z2}$.

Each of the spin valve GMR elements 24a, 24b, 24c and 24d has a multi-layered structure mainly consisting of a magnetization fixed layer constituted by a pin layer of an anti-ferromagnetic material and a pinned layer of a ferromagnetic material, a nonmagnetic space layer, and a magnetization free layer (free layer) of a ferromagnetic material. The magnetization of the pinned layer of each element is fixed in the same direction perpendicular to a running direction of the free layer. Namely, in the second magnetic field detection sensor 24, all the pinned layers of the spin valve GMR elements 24a, 24b, 24c and 24d are fixed in the same direction that is the X-axis direction.

The bias magnetic fields respectively applied to the pair of spin valve GMR elements 24a and 24b connected in series with each other are in the directions substantially opposite to each other. Thus, the magnetization directions of the respective pinned layers in these spin valve GMR elements 24a and 24b are fixed to the same direction. The bias magnetic fields in the directions opposite to each other are obtained because a closed magnetic loop is formed by the pair of permanent magnets $22b_1$ and $22b_2$ and the magnetic material member $22b_3$, and the pair of spin valve GMR elements 24a and 24b are arranged in the respective paths of the closed magnetic loop, through which magnetic fields flow in the directions opposite to each other, as shown in FIG. 5 and as more clearly shown in FIG. 11 described later. In this case, the center of the magnetic circuit that constitutes the closed magnetic loop is located on the centerline between the pair of spin valve GMR elements 24a and 24b.

To the pair of spin valve GMR elements 24c and 24d connected in series with each other, the same bias magnetic fields in the directions substantially opposite to each other are applied and the magnetization directions of the respective pinned layers in these spin valve GMR elements 24c and 24d are fixed to the same direction. In this case, also, the center of the magnetic circuit that constitutes the closed magnetic loop is located on the centerline between the pair of spin valve GMR elements 24c and 24d.

Since the magnetization directions of the respective pinned layers in the pair of spin valve GMR elements 24a and 24b and the pair of spin valve GMR elements 24c and 24d are fixed to the same direction by applying the opposite direction bias magnetic fields thereto, these four spin valve GMR elements 24a, 24b, 24c and 24d can be formed in a single chip resulting the acceleration sensor to more downsize.

In the third magnetic field detection sensor 25 for detecting acceleration in the Y-axis direction, two pairs of or four spin valve GMR elements 25a, 25b, 25c and 25d are formed in parallel with each other. Each of the spin valve GMR elements 25a to 25d has a linear section running along a direction (X-axis direction) perpendicular to the Y-axis. The spin valve GMR elements 25a and 25b constitute one pair and, in this embodiment, they are connected in series with each other. Both ends of the serially connected elements 25b and 25a are electrically connected to power supply terminal electrodes $T_{VCC}$ and $T_{VDD}$, respectively. The central point between the elements 25b and 25a is electrically connected to a signal output terminal $T_{Y1}$. The spin valve GMR elements 25c and 25d also constitute one pair and, in this embodiment, they are connected in series with each other. Both ends of the serially connected elements 25c and 25d are electrically connected to the power supply terminal electrodes $T_{VCC}$ and $T_{VDD}$, respectively. The central point between the elements 25c and 25d is electrically connected to a signal output terminal $T_{Y2}$.

Each of the spin valve GMR elements 25a, 25b, 25c and 25d has a multi-layered structure mainly consisting of a magnetization fixed layer constituted by a pin layer of an anti-ferromagnetic material and a pinned layer of a ferromagnetic material, a nonmagnetic space layer, and a magnetization free layer (free layer) of a ferromagnetic material. The magnetization of the pinned layer of each element is fixed in the same direction perpendicular to a running direction of the free layer. Namely, in the third magnetic field detection sensor 25, all the pinned layers of the spin valve GMR elements 25a, 25b, 25c and 25d are fixed in the same direction that is the Y-axis direction.

The bias magnetic fields respectively applied to the pair of spin valve GMR elements 25a and 25b connected in series with each other are in the directions substantially opposite to each other. Thus, the magnetization directions of the respective pinned layers in these spin valve GMR elements 25a and 25b are fixed to the same direction. The bias magnetic fields in the directions opposite to each other are obtained because a closed magnetic loop is formed by the pair of permanent magnets $22c_1$ and $22c_2$ and the magnetic material member $22c_3$, and the pair of spin valve GMR elements 25a and 25b are arranged in the respective paths of the closed magnetic loop, through which magnetic fields flow in the directions opposite to each other, as shown in FIG. 5 and as more clearly shown in FIG. 11 described later. In this case, the center of the magnetic circuit that constitutes the closed magnetic loop is located on the centerline between the pair of spin valve GMR elements 25a and 25b.

To the pair of spin valve GMR elements 25c and 25d connected in series with each other, the same bias magnetic fields in the directions substantially opposite to each other are applied and the magnetization directions of the respective pinned layers in these spin valve GMR elements 25c and 25d are fixed to the same direction. In this case, also, the center of the magnetic circuit that constitutes the closed magnetic loop is located on the centerline between the pair of spin valve GMR elements 25c and 25d.

Since the magnetization directions of the respective pinned layers in the pair of spin valve GMR elements 25a and 25b and the pair of spin valve GMR elements 25c and 25d are fixed to the same direction by applying the opposite direction bias magnetic fields thereto, these four spin valve GMR elements 25a, 25b, 25c and 25d can be formed in a single chip resulting the acceleration sensor to more downsize.

The power supply voltage $V_{cc}$-$V_{dd}$ is applied across the spin valve GMR elements 23a and 23b of the first magnetic field detection sensor 23, and a first X-axis acceleration signal $V_{X1}$ is derived from the signal output terminal $T_{X1}$ connected to the central point there between. Also, the power supply voltage $V_{cc}$-$V_{dd}$ is applied across the spin valve GMR elements 24b and 24a of the second magnetic field detection sensor 24, and a second X-axis acceleration signal $V_{X2}$ is derived from the signal output terminal $T_{X2}$ connected to the central point there between. Therefore, these spin valve GMR elements 23a, 23b, 24b and 24a are connected in full-bridge configuration as shown in FIG. 6a. The signals $V_{X1}$ and $V_{X2}$ from the respective signal output terminals $T_{X1}$ and $T_{X2}$ are differentially amplified to become an acceleration signal in the X-axis direction. This acceleration signal in the X-axis direction is provided only when the magnetic field generation member with weight 22a, that is the permanent magnets $22a_1$ and $22a_2$ and the magnetic material member $22a_3$, and the magnetic field generation member with weight 22b, that is the permanent magnets $22b_1$ and $22b_2$ and the magnetic material member $22b_3$, displace to the opposite directions to each other along the Z-axis direction due to the applied acceleration. When the magnetic field generation members with weights 22a and 22b displace together to the same direction, because the first and second X-axis acceleration signals $V_{X1}$ and $V_{X2}$ cancel each other out, no acceleration signal in the X-axis direction is provided.

The power supply voltage $V_{cc}$-$V_{dd}$ is applied across the spin valve GMR elements 23c and 23d of the first magnetic field detection sensor 23, and a first Z-axis acceleration signal $V_{Z1}$ is derived from the signal output terminal $T_{Z1}$ connected to the central point there between. Also, the power supply voltage $V_{cc}$-$V_{dd}$ is applied across the spin valve GMR elements 24c and 24d of the second magnetic field detection sensor 24, and a second Z-axis acceleration signal $V_{Z2}$ is derived from the signal output terminal $T_{Z2}$ connected to the central point there between. Therefore, these spin valve GMR elements 23c, 23d, 24c and 24d are connected in full-bridge configuration as shown in FIG. 6b. The signals $V_{Z1}$ and $V_{Z2}$ from the respective signal output terminals $T_{Z1}$ and $T_{Z2}$ are differentially amplified to become an acceleration signal in the Z-axis direction. This acceleration signal in the Z-axis direction is provided only when the magnetic field generation member with weight 22a, that is the permanent magnets $22a_1$ and $22a_2$ and the magnetic material member $22a_3$, and the magnetic field generation member with weight 22b, that is the permanent magnets $22b_1$ and $22b_2$ and the magnetic material member $22b_3$, displace together to the same direction along the Z-axis direction due to the applied acceleration. When the magnetic field generation members with weights 22a and 22b displace to the opposite directions to each other, because the first and second Z-axis acceleration signals $V_{Z1}$ and $V_{Z2}$ cancel each other out, no acceleration signal in the Z-axis direction is provided.

The power supply voltage $V_{cc}$-$V_{dd}$ is applied across the spin valve GMR elements 25b and 25a of the third magnetic field detection sensor 25, and a first Y-axis acceleration signal $V_{Y1}$ is derived from the signal output terminal $T_{Y1}$ connected to the central point there between. Also, the power supply voltage $V_{cc}$-$V_{dd}$ is applied across the spin valve GMR elements 25c and 25d of the third magnetic field detection sensor 25, and a second Y-axis acceleration signal $V_{Y2}$ is derived from the signal output terminal $T_{Y2}$ connected to the central point there between. Therefore, these spin valve GMR elements 25a, 25b, 25c and 25d of the third magnetic field detection sensor 25 are connected in full-bridge configuration as shown in FIG. 6c. The signals $V_{Y1}$ and $V_{Y2}$ from the respective signal output terminals $T_{Y1}$ and $T_{Y2}$ are differentially amplified to become an acceleration signal in the Y-axis direction. This acceleration signal in the Y-axis direction is provided when the magnetic field generation member with weight 22c, that is the permanent magnets $22c_1$ and $22c_2$ and the magnetic material member $22c_3$, displaces along the Z-axis direction due to the applied acceleration.

Hereinafter, relationship in positions between the permanent magnet(s) and the spin valve GMR element according to this embodiment will be described in detail.

Figure 9A:
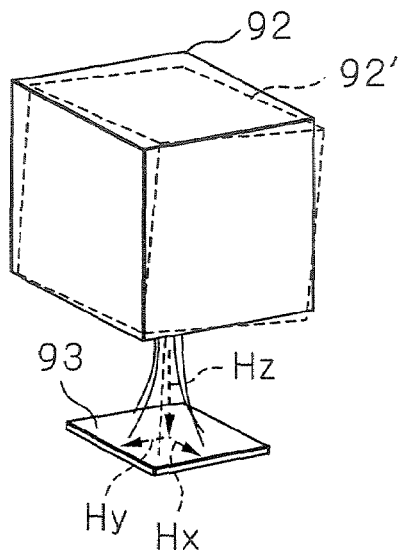
FIGS. 9a and 9b are views illustrating magnetic field components in pinned direction and in free direction when the permanent magnet in the acceleration sensor shown in FIG. 2 slightly inclines.
Figure 9B:
Figure 10A:
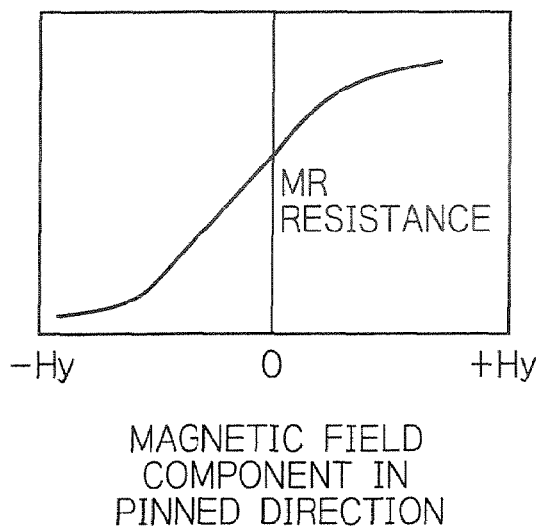
FIGS. 10a and 10b are characteristic graphs illustrating change in MR resistance of the spin valve GMR element with respect to magnetic field components in pinned direction and in free direction.
Figure 10B:
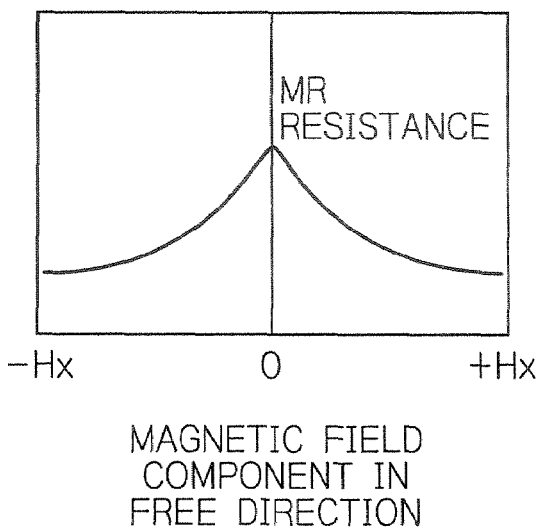

FIGS. 9a and 9b illustrate magnetic field components in pinned direction and in free direction when the permanent magnet in the acceleration sensor shown in FIG. 2 slightly inclines, FIGS. 10a and 10b illustrate change in MR resistance of the spin valve GMR element with respect to magnetic field components in pinned direction and in free direction, and FIG. 11 illustrates position relationship between the permanent magnets and the spin valve GMR element in the acceleration sensor.

When a permanent magnet 92 arranged to face a magnetic field detection sensor 93 slightly inclines as shown in FIG. 9a, the magnetic field applied to the magnetic field detection sensor 93 from the inclined permanent magnet 92' includes not only a component Hz that is perpendicular to the film surface of a spin valve GMR element 93a in the magnetic field detection sensor 93 but also a free direction component Hx and a pinned direction component Hy shown in FIG. 9b, which are parallel to the film surface of the spin valve GMR element 93a.

The MR resistance characteristics of the spin valve GMR element when such magnetic field component in the pinned direction Hy will be expressed as shown in FIG. 10a, and the MR resistance characteristics of the spin valve GMR element when such magnetic field component in the free direction Hx will be expressed as shown in FIG. 10b. As will be noted from FIG. 10a, the MR resistance characteristics with respect to the pinned direction magnetic field component Hy provides good linearity and high sensitivity around Hy=0. Therefore, external force is detected along this pinned direction. Contrary to this, as illustrated in FIG. 10b, the MR resistance characteristics with respect to the free direction magnetic field component Hx exhibits non-linearity and abruptly changes around Hx=0. Thus, it is desired that the acceleration sensor has low sensitivity for this free direction magnetic field component Hx.

Basically, when the internal coupling magnetic field Hin is exactly zero, angles in both the pinned direction and the free direction never respond to change in the free direction magnetic field component. However, in actual fact, the pinned direction component of the magnetic field produced from the permanent magnets similarly acts as the internal coupling magnetic field Hin. Thus, it is required as much as possible (1) to reduce the internal coupling magnetic field Hin, and (2) to suppress change in the pinned direction magnetic field component along the pinned direction. Although the internal coupling magnetic field Hin can be controlled depending upon the thickness of the nonmagnetic space layer (Cu layer) of the spin valve GMR element, it is difficult to be completely suppressed. This is because the internal coupling magnetic field Hin will change several tens A/m for the change in the Cu layer thickness of about 0.1 nm. Particularly, such noise will become the largest when the signal slightly changes around zero, and therefore complete suppression of noise is difficult only by controlling the Cu layer thickness. Also, since it is necessary to use an extremely large permanent magnet in order to completely control the change in the pinned direction magnetic field component along the pinned direction to zero, miniaturization of the acceleration sensor cannot be attained.

In order to solve such problems, according to this embodiment as shown in FIG. 11, a closed magnetic loop is formed by the pair of permanent magnets $112_1$ and $112_2$ and the magnetic material member $112_3$, and these permanent magnets $112_1$ and $112_2$ are arranged such that the longitudinal direction of the respective permanent magnets becomes in parallel with the pinned direction of the spin valve GMR elements $113a$ and $113c$ and the spin valve GMR elements $113b$ and $113d$ of the magnetic field detection sensor $113$. Thus, the change, along the pinned direction, in the pinned direction component of the magnetic field that is applied from the permanent magnets $112_1$ and $112_2$ is decreased and also the free direction component of the magnetic field itself is decreased. As a result, noise can be suppressed from production, and high sensitivity and good linearity in detection of acceleration can be attained.

FIG. 12 illustrates structure of each magnetic field generation member with weight shown in FIG. 2.

As shown in the figure, a magnetic field generation member with weight $122$ is formed from a pair of permanent magnets $122_1$ and $122_2$ and a magnetic material member $122_3$ for magnetically connecting surfaces of these permanent magnets $122_1$ and $122_2$, which surfaces are opposite to their surfaces facing a magnetic field detection sensor $123$, each other to constitute a magnetic return path. Each of the permanent magnets $122_1$ and $122_2$ has a multi-layered structure of hard magnetic material layers $124$ and nonmagnetic material layers $125$ alternately laminated each other in a direction that is perpendicular to the film plane of the magnetic field detection sensor $123$ and to the pinned direction of pinned layers of its spin valve GMR elements. In this embodiment, three hard magnetic material layers $124$ and two nonmagnetic material layers $125$ are alternately laminated. However, according to the present invention, the numbers of these laminated layers are not limited to these values. Also, heights and thicknesses of the hard magnetic material layers $124$ and the nonmagnetic material layers $125$, and separation distances between their top ends and the magnetic field detection sensor $123$ shown in the figure are mere example but not limited to these values.

Each hard magnetic material layer $124$ in this embodiment is made of a ferrite material. However, in the present invention, any hard magnetic material other than the ferrite material may be used as the hard magnetic material layer $124$. Each nonmagnetic material layer $125$ in this embodiment is made of a nonmagnetic ceramic material such as for example AlTiC ($Al_2O_3$—TiC). However, in the present invention, any nonmagnetic material other than the nonmagnetic ceramic material may be used as the nonmagnetic material layer $125$. If a metal material is used as the hard magnetic material layer $124$, a nonmagnetic metal material may be used as the nonmagnetic material layer $125$. The magnetic material member $122_3$ is made of a typical soft magnetic material such as for example NiFe or else.

In case that the nonmagnetic material layer $125$ is made of a nonmagnetic material with a higher specific gravity such as for example $ZrO_2$, $Ta_2O_5$, $CeO_2$ or else, it is possible to increase the sensitivity of the acceleration sensor because the total weight of the magnetic field generation member with weight is increased with keeping its size.

Such magnetic field generation members with weight having the multi-layered structure will be fabricated by alternately adhering hard magnetic material substrates and nonmagnetic material substrates, which are processed to have predetermined thicknesses, each other, by cutting into separate piece of permanent magnet, by magnetizing the permanent magnets, and then by adhering magnetic material members that constitute magnetic return paths to the respective pairs of the permanent magnets.

Figure 13A:
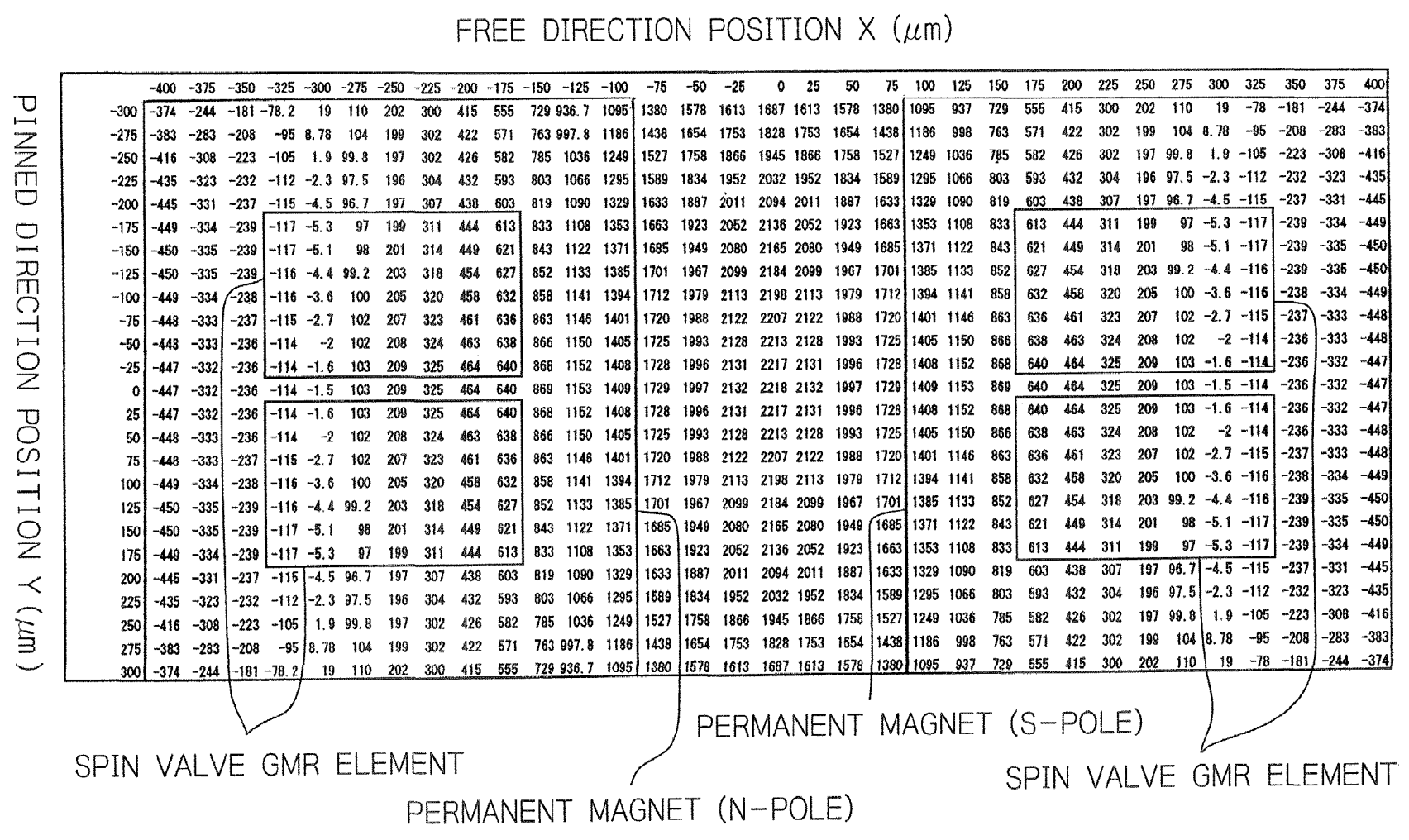

FIG. 13a illustrates the simulation result of distribution of free direction magnetic field components Hx (Gauss) applied to a magnetic field detection sensor from a pair of permanent magnets in case that each permanent magnet is formed by a single layer of a hard magnetic material and FIG. 13b illustrates the simulation result of distribution of free direction magnetic field components Hx (Gauss) applied to a magnetic field detection sensor from a pair of permanent magnets in case that each permanent magnet is formed in a multi-layered structure with hard magnetic material layers and nonmagnetic material layers as in this embodiment.

In this simulation example, dimensions of each permanent magnet are 600 µm in the longitudinal or axial direction in a surface to be faced the magnetic field detection sensor, 300 µm in the lateral direction in this surface, and 400 µm in the height direction. A space between the two permanent magnets is 200 µm, and a residual magnetic flux density Br of the hard magnetic material layer is Br=2,200 Gauss. In the example shown in FIG. 13b, each permanent magnet consists of three hard magnetic material layers with the thickness shown in FIG. 12 and two nonmagnetic material layers with the thickness shown in FIG. 12.

Arrangement of the two permanent magnets is as follows. In FIGS. 13a and 13b, one permanent magnet locates in the range from Y=−300 µm to Y=300 µm in the pinned direction and from X=−400 µm to X=−100 µm in the free direction, and the other permanent magnet locates in the range from Y=−300 µm to Y=300 µm in the pinned direction and from X=100 µm to X=400 µm in the free direction. Dimensions of each spin valve GMR element are 150 µm×150 µm, and distance between the permanent magnets and the spin valve GMR elements is 100 µm. The center of the pair of permanent magnets locates at X=0 µm in the free direction.

The four spin valve GMR elements in this simulation locate in the range from Y=−175 µm to Y=−25 µm in the pinned direction and from X=−325 µm to X=−175 µm in the free direction, in the range from Y=25 µm to Y=175 µm in the pinned direction and from X=−325 µm to X=−175 µm in the free direction, in the range from Y=−175 µm to Y=−25 µm in the pinned direction and from X=175 µm to X=325 µm in the free direction, and in the range from Y=25 µm to Y=175 µm in the pinned direction and from X=175 µm to X=325 µm in the free direction, respectively.

As will be noted from these figures, the distribution of the free direction magnetic field components Hx, shown in FIG. 13b, caused by the permanent magnets with the multi-layered structure is substantially the same as that, shown in FIG. 13a, caused by the permanent magnets with the single layer structure.

Figure 14B:
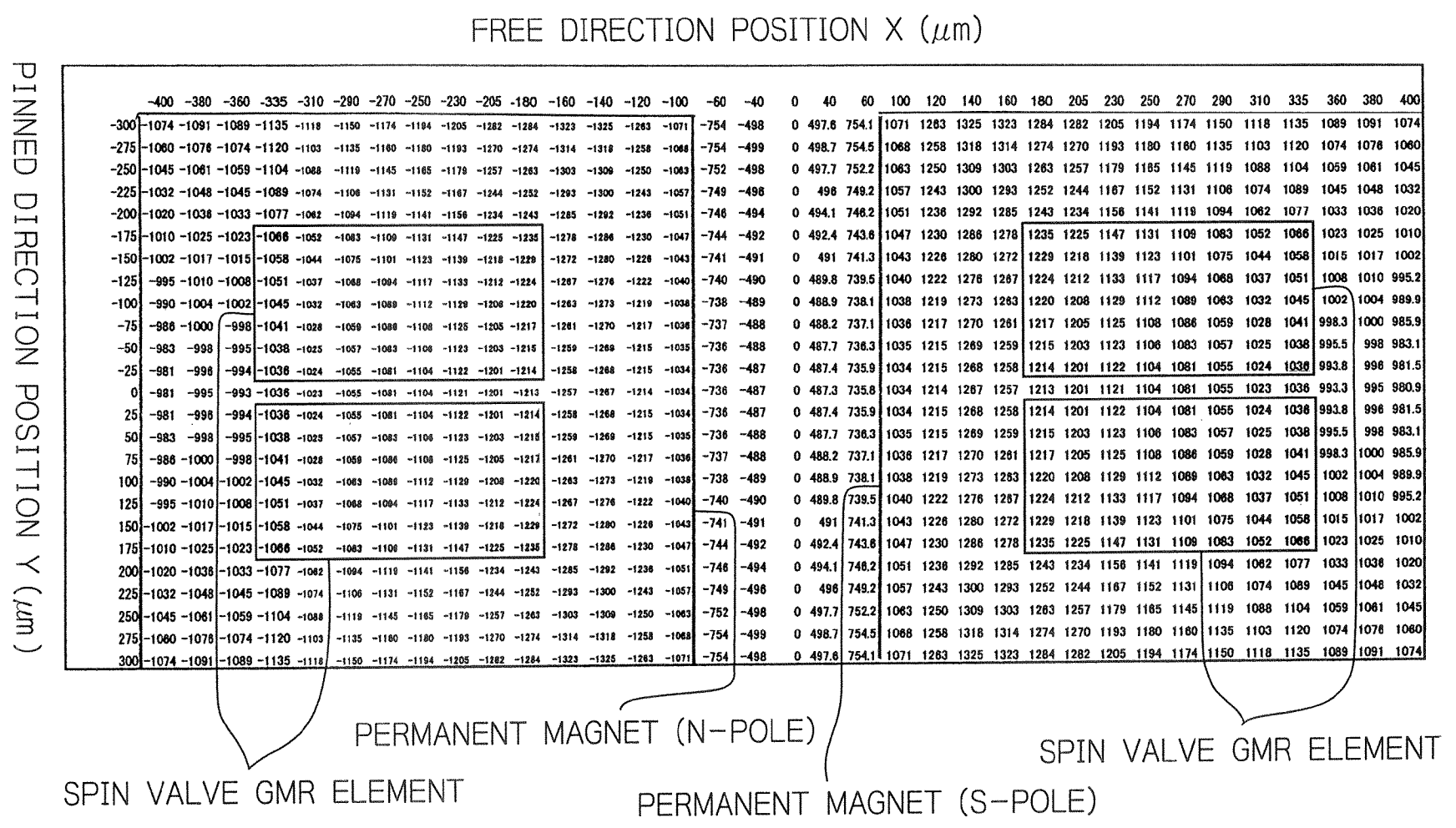

FIG. 14a illustrates the simulation result of distribution of perpendicular direction magnetic field components Hz (Gauss) applied to a magnetic field detection sensor from a pair of permanent magnets in case that each permanent magnet is formed by a single layer of a hard magnetic material, and FIG. 14b illustrates the simulation result of distribution of perpendicular direction magnetic field components Hz (Gauss) applied to a magnetic field detection sensor from a pair of permanent magnets in case that each permanent magnet is formed in a multi-layered structure with hard magnetic material layers and nonmagnetic material layers as in this embodiment.

Dimensions and located ranges of each permanent magnet and each spin valve GMR element, a space between the two permanent magnets, a distance between the permanent magnets and the spin valve GMR elements in this simulation are substantially the same as those in the simulation of FIGS. 13a and 13b.

As will be noted from these figures, within the regions where the spin valve GMR elements are located, the perpendicular direction magnetic field components Hz, shown in FIG. 14b, caused by the permanent magnets with the multi-layered structure have enough values of 1,000 or more Gauss as well as those, shown in FIG. 14a, caused by the permanent magnets with the single layer structure.

Figure 15A:
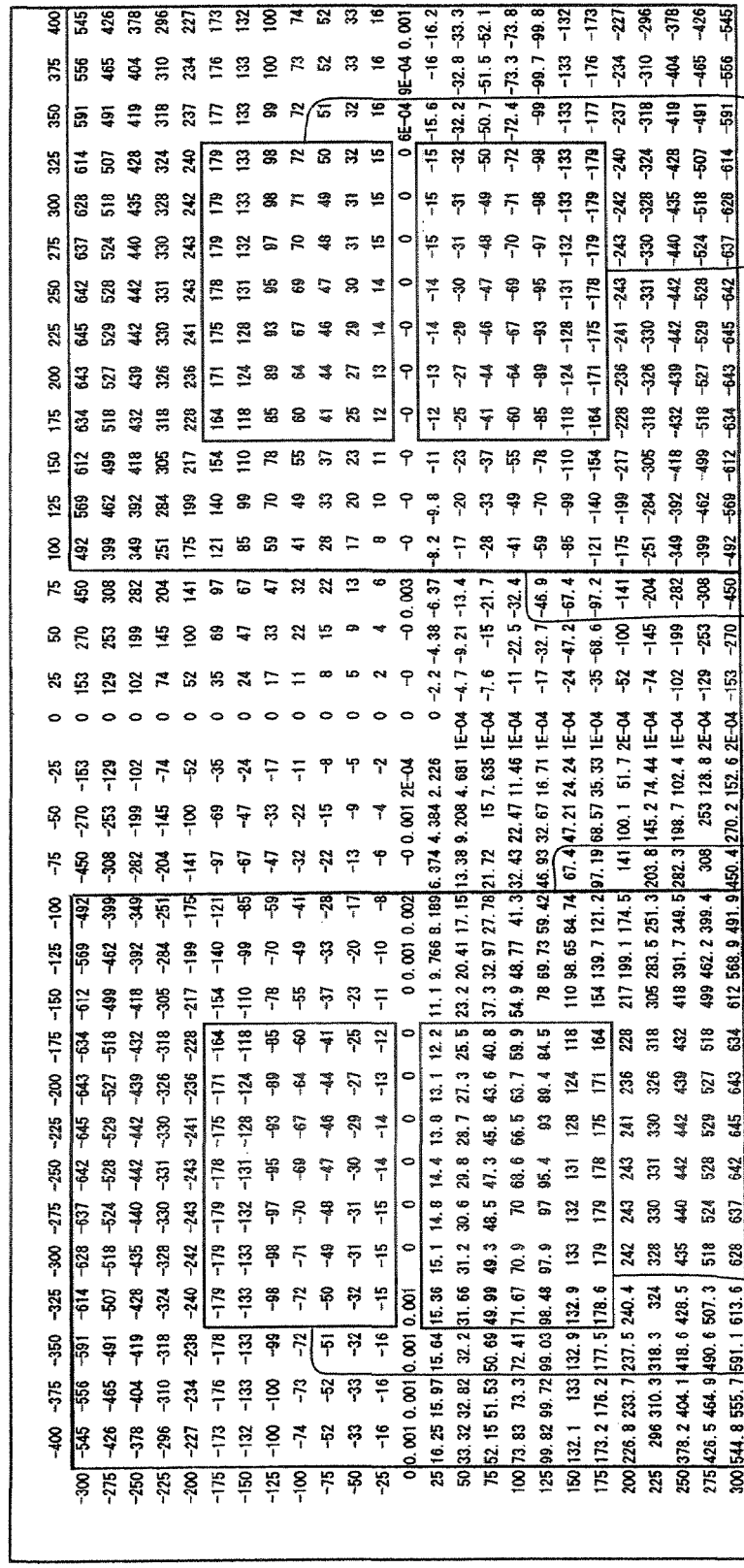
FIG. 15a is a view illustrating the simulation result of distribution of pinned direction magnetic field components Hy applied to a magnetic field detection sensor from a pair of permanent magnets in case that each permanent magnet is formed by a single layer of a hard magnetic material.
Figure 15B:
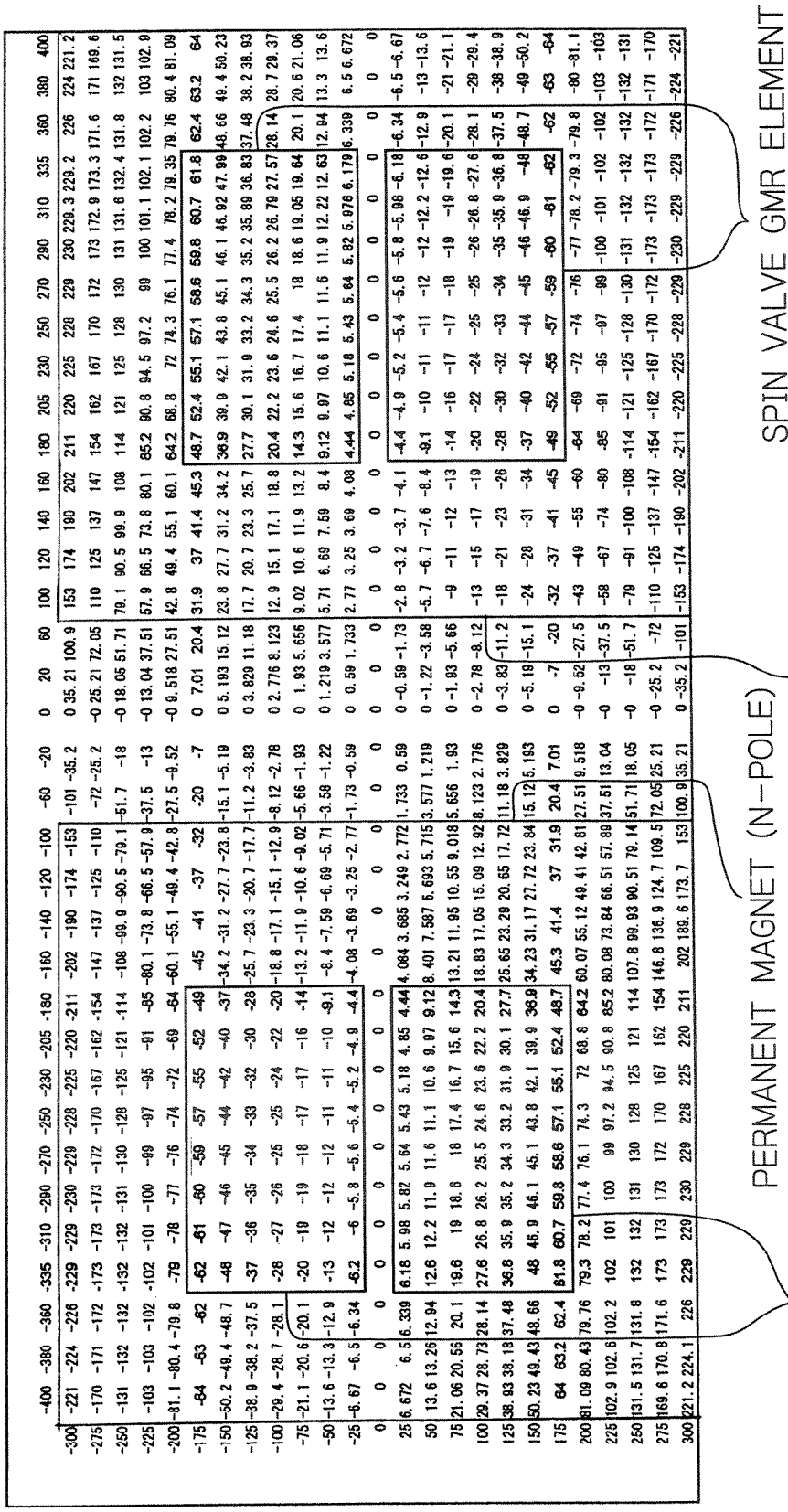
FIG. 15b is a view illustrating the simulation result of distribution of pinned direction magnetic field components Hy applied to a magnetic field detection sensor from a pair of permanent magnets in case that each permanent magnet is formed in a multi-layered structure with hard magnetic material layers and nonmagnetic material layers as shown in FIG. 2.

FIG. 15a illustrates the simulation result of distribution of pinned direction magnetic field components Hy (Gauss) applied to a magnetic field detection sensor from a pair of permanent magnets in case that each permanent magnet is formed by a single layer of a hard magnetic material, and FIG. 15b illustrates the simulation result of distribution of pinned direction magnetic field components Hy (Gauss) applied to a magnetic field detection sensor from a pair of permanent magnets in case that each permanent magnet is formed in a multi-layered structure with hard magnetic material layers and nonmagnetic material layers as in this embodiment.

Dimensions and located ranges of each permanent magnet and each spin valve GMR element, a space between the two permanent magnets, a distance between the permanent magnets and the spin valve GMR elements in this simulation are substantially the same as those in the simulation of FIGS. 13a and 13b.

As will be noted from these figures, within the regions where the spin valve GMR elements are located, the distribution of the pinned direction magnetic field components Hy, shown in FIG. 15b, caused by the permanent magnets with the multi-layered structure has extremely less variations than those, shown in FIG. 15a, caused by the permanent magnets with the single layer structure. Since these pinned direction magnetic field components are the magnetic field components to be detected, it is desired that their variations along the pinned direction are as small as possible. Therefore, it is possible to extremely improve the sensitivity and linearity in detection of acceleration by using the permanent magnets with the multi-layered structure as in this embodiment.

The aforementioned simulation results are based upon simulations executed under the specific conditions. However, it was confirmed that the similar differences occurred between the cases using the permanent magnets with the multi-layered structure and the permanent magnets with the single layer structure by executing simulations under the different conditions.

Figure 16:
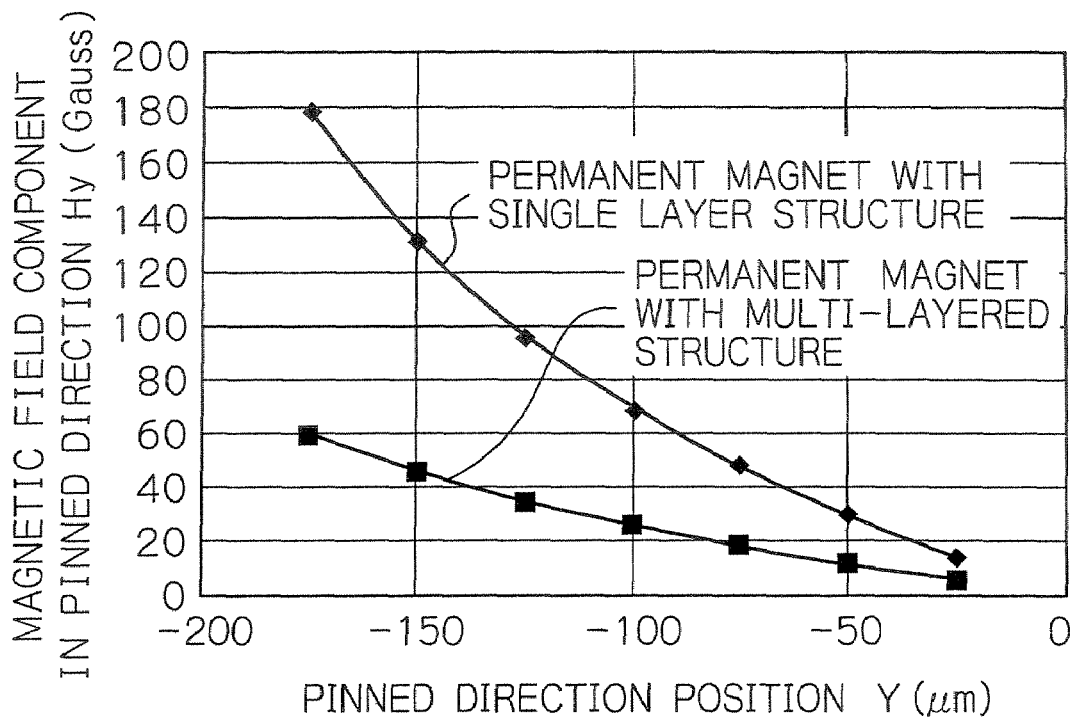
FIG. 16 is a view illustrating characteristics of pinned direction magnetic field component Hy versus position in the pinned direction in case that permanent magnets with a single layer structure and a multi-layered structure are used, respectively.

FIG. 16 illustrates characteristics of pinned direction magnetic field component Hy versus position in the pinned direction Y in case that permanent magnets with a single layer structure and a multi-layered structure are used, respectively. More concretely, this characteristics is obtained by plotting the pinned direction magnetic field component Hy at the positions in the pinned direction Y=0-175 μm and at the position in the free direction of X=250 μm in the simulation result of FIGS. 15a and 15b.

As will be clearly understood from the figure, the change, along the pinned direction, in the pinned direction component of the magnetic field that is the component to be detected according to the permanent magnet with the multi-layered structure of hard magnetic material layers and nonmagnetic material layers extremely reduces in comparison with that according to the permanent magnet with the single layer structure. As a result, sensitivity and linearity of the acceleration sensor can be greatly improved.

Figure 17:
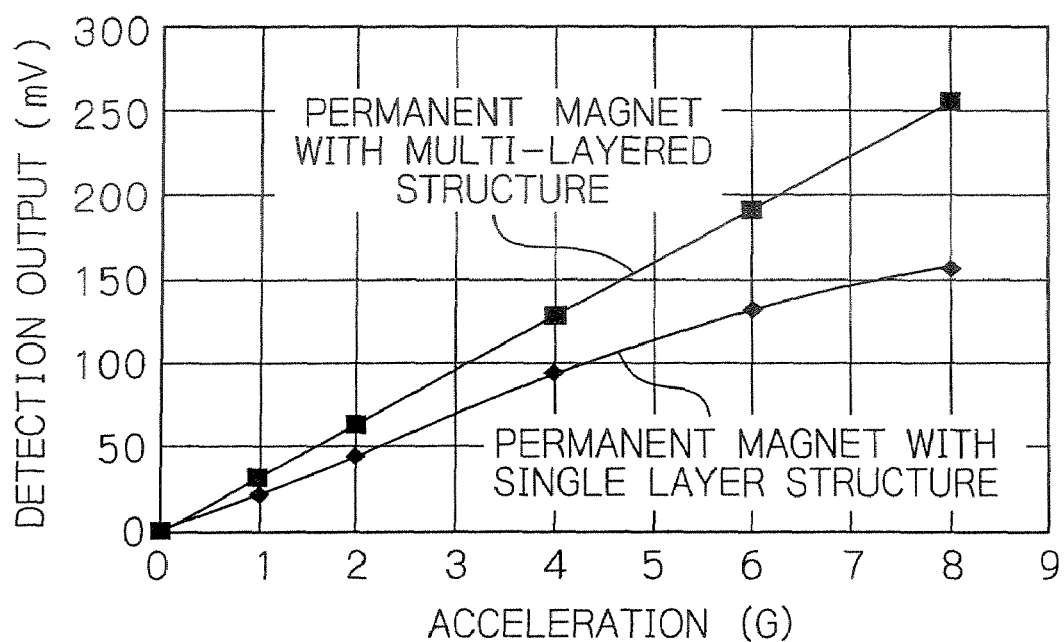
FIG. 17 is a view illustrating characteristics of detection output of a spin valve GMR element versus acceleration applied to acceleration sensors using permanent magnets with a single layer structure and a multi-layered structure, respectively.

FIG. 17 illustrates characteristics of detection output of a spin valve GMR element versus acceleration applied to acceleration sensors using permanent magnets with a single layer structure and a multi-layered structure, respectively. In the figure, the longitudinal axis of detection output indicates a 100-fold amplified value of the output of the acceleration sensor. Dimensions and located ranges of each permanent magnet and each spin valve GMR element, a space between the two permanent magnets, a distance between the permanent magnets and the spin valve GMR elements in this simulation are substantially the same as those in the simulation of FIGS. 13a and 13b.

It will be also understood from the figure that using of the permanent magnet with the multi-layered structure of hard magnetic material layers and nonmagnetic material layers improves sensitivity of acceleration and linearity in the response as compared to using of the permanent magnet with the single layer structure of hard magnetic material layer. In fact, as shown in the figure, when the acceleration of 1 G is applied, the detection output of about 22 mV is obtained in case that the permanent magnet with the single layer structure of hard magnetic material layer is used, whereas the detection output of about 32 mV is obtained in case that the permanent magnet with the multi-layered structure of three hard magnetic material layers, each having a thickness of 80 μm, and two nonmagnetic material layers is used. The detection output of about 29 mV is obtained in case that the permanent magnet with the multi-layered structure, each hard magnetic material layer having a thickness of 90 μm, is used. Also, the detection output of about 33 mV is obtained in case that the permanent magnet with the multi-layered structure, each hard magnetic material layer having a thickness of 70 μm, is used. In case that the permanent magnet with the multi-layered structure is used, the thinner of the hard magnetic material layer, the higher sensitivity can be obtained, but when the thickness becomes 80 μm or less, the sensitivity is substantially saturated.

Hereinafter, structures and operations of the spring member 21 of this embodiment will be described in detail.

FIGS. 18a, 18b and 18c illustrate fundamental operations of a strip-shaped plate spring of the spring member according to the present invention.

In FIG. 18a, which shows a state where no external force is applied, reference numeral 180 denotes the strip-shaped plate spring, 181 denotes a bending center or fulcrum located at one end of the strip-shaped plate spring 180, and 182 denotes a weight member fixed to the other end of the strip-shaped plate spring 180, which is separated from the bending center 181. In the following description, a direction perpendicular to the surface of the strip-shaped plate spring 180 is called as a bending direction and a longitudinal direction of the strip-shaped plate spring 180 is called as a length direction as shown in FIG. 18a.

When an external force in the bending direction is applied as shown in FIG. 18b and also when an external force in the length direction is applied as shown in FIG. 18c, the strip-shaped plate spring 180 produces bending stress to displace the other end thereof and the weight member 182 in the bending direction.

FIGS. 19a and 19b illustrate operations of a strip-shaped plate spring 190 with two strip-shaped plate springs shown in FIGS. 18a-18c developed from their bending centers to opposite sides, in other words, the strip-shaped plate spring 190 having a fulcrum 191 at its center and both end sections on which weight members 192a and 192b are attached, respectively.

When an external force $F_Z$ in the bending direction is applied as shown in FIG. 19a, the both end sections of the strip-shaped plate spring 190 and the weight members 192a and 192b displace together in the same bending direction. On the other hand, when an external force $F_X$ in the length direction is applied as shown in FIG. 19b, the end sections of the strip-shaped plate spring 190 and the weight members 192a and 192b displace in the opposite bending directions each other. If the external force $F_Z$ of FIG. 19a and the external force $F_X$ of FIG. 19b have the relationship of $|F_Z|=|F_X|$, displacement amounts of the weight members 192a and 192b become equal. The displacement amounts of the weight members 192a and 192b are proportional to displacement angles θ of the weight members 192a and 192b. In case that the weight members are formed by permanent magnets for generating magnetic fields, the spin valve GMR elements can detect the displacement angles θ to know the applied external force.

Figure 20A:
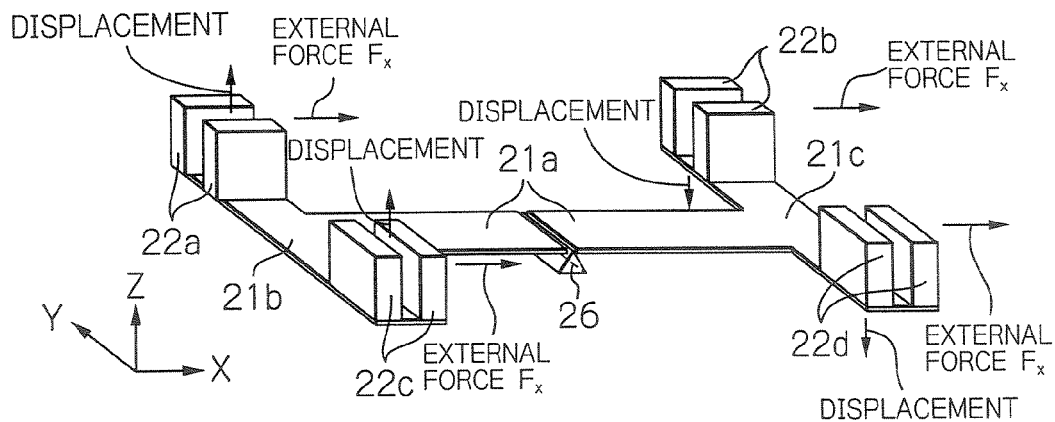
FIGS. 20a, 20b and 20c are oblique views illustrating operations of the spring member shown in FIG. 2.
Figure 20B:
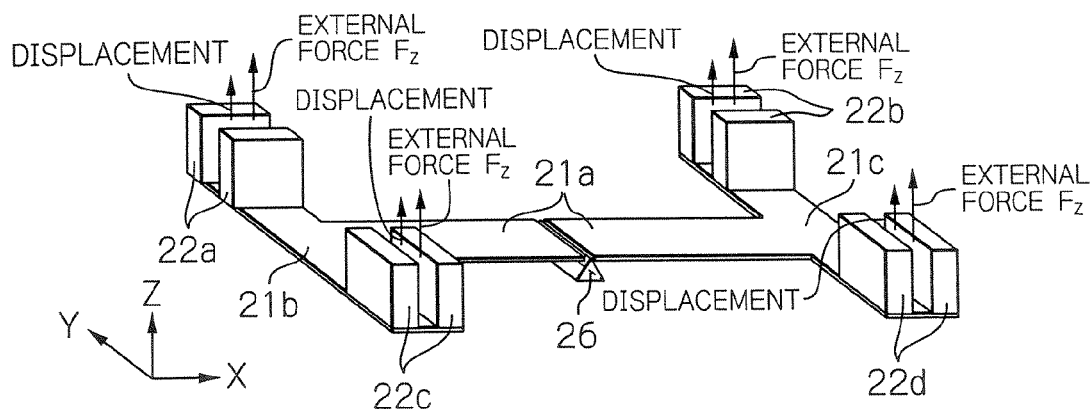
Figure 20C:
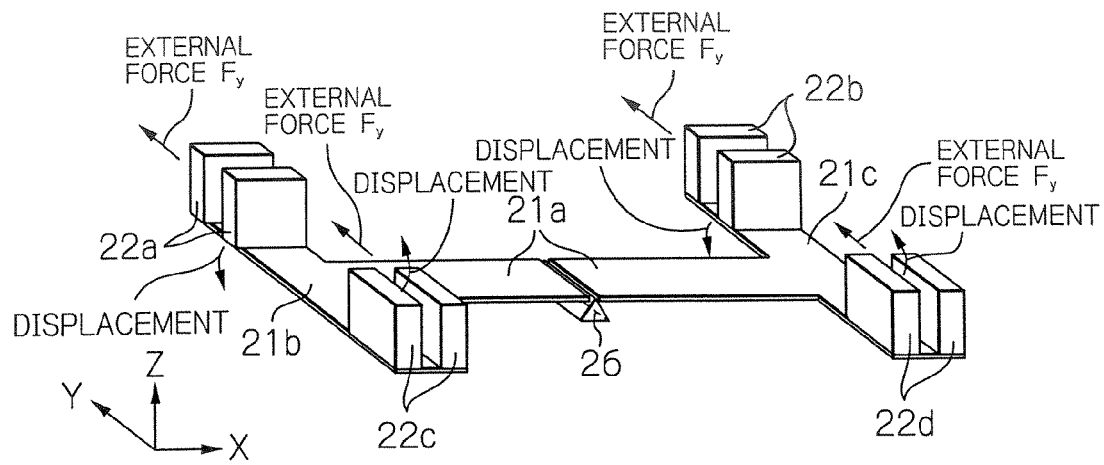

FIGS. 20a, 20b and 20c illustrate operations of the spring member in this embodiment.

When an external force $F_X$ along the X-axis direction is applied as shown in FIG. 20a, the first strip-shaped plate spring or main spring 21a and the second strip-shaped plate springs or sub-springs 21b and 21c produce bending stresses together to displace them in the bending direction to reach balance. In this case, the displaced directions of the magnetic field generation members with weights 22a and 22c and the magnetic field generation members with weights 22b and 22d are opposite directions each other. When an external force $F_Z$ along the Z-axis direction is applied as shown in FIG. 20b, the first strip-shaped plate spring or main spring 21a and the second strip-shaped plate springs or sub-springs 21b and 21c produce bending stresses together to displace them in the bending direction to reach balance. In this case, the displaced directions of the magnetic field generation members with weights 22a and 22c and the magnetic field generation members with weights 22b and 22d are the same direction. When an external force $F_Y$ along the Y-axis direction is applied as shown in FIG. 20c, the first strip-shaped plate spring or main spring 21a produces a twisting stress rotating around the center of its length direction and the second strip-shaped plate springs or sub-springs 21b and 21c produce bending stresses to displace them in the rotational direction around the center of the length direction of the main spring to reach balance. In this case, the displaced directions of the magnetic field generation members with weights 22a and 22b and the magnetic field generation members with weights 22c and 22d are opposite directions each other.

When an external force $F_X$ along the X-axis direction is applied and the magnetic field generation members with weights 22a and 22c and the magnetic field generation members with weights 22b and 22d displace in the bending direction of the main spring as aforementioned, angles of the bias magnetic fields applied to the spin valve GMR elements 23a and 23b and the spin valve GMR elements 24b and 24a accordingly change to the same direction. Thus, an added differential output of the first X-axis acceleration signal $V_{X1}$ and the second X-axis acceleration signal $V_{X2}$ is derived to provide it as an acceleration signal in the X-axis direction. In this case, since the first Z-axis acceleration signal $V_{Z1}$ and the second Z-axis acceleration signal $V_{Z2}$ cancel each other out, no acceleration signal in the Z-axis direction is provided. Also, in this case, because the bias magnetic field angle changes along the running direction of the free layers of the spin valve GMR elements 25d, 25b, 25c and 25a, the first Y-axis acceleration signal $V_{Y1}$ and the second Y-axis acceleration signal $V_{Y2}$ are not produced and therefore no acceleration signal in the Y-axis direction is provided.

When an external force $F_Z$ along the Z-axis direction is applied and the magnetic field generation members with weights 22a and 22c and the magnetic field generation members with weights 22b and 22d displace in the bending direction of the main spring as aforementioned, angles of the bias magnetic fields applied to the spin valve GMR elements 23c and 23d and the spin valve GMR elements 24c and 24d accordingly change to the opposite directions. Thus, an added differential output of the first Z-axis acceleration signal $V_{Z1}$ and the second Z-axis acceleration signal $V_{Z2}$ is derived to provide it as an acceleration signal in the Z-axis direction. In this case, since the first X-axis acceleration signal $V_{X1}$ and the second X-axis acceleration signal $V_{X2}$ cancel each other out, no acceleration signal in the X-axis direction is provided. Also, in this case, because the bias magnetic field angle changes along the running direction of the free layers of the spin valve GMR elements 25d, 25b, 25c and 25a, the first Y-axis acceleration signal $V_{Y1}$ and the second Y-axis acceleration signal $V_{Y2}$ are not produced and therefore no acceleration signal in the Y-axis direction is provided.

When an external force $F_Y$ along the Y-axis direction is applied and the magnetic field generation members with weights 22a and 22c and the magnetic field generation members with weights 22b and 22d displace in the rotational direction around the center of the length direction of the main spring as aforementioned, angles of the bias magnetic fields applied to the spin valve GMR elements 25d, 25b, 25c and 25a accordingly change to the same direction. Thus, an added differential output of the first Y-axis acceleration signal $V_{Y1}$ and the second Y-axis acceleration signal $V_{Y2}$ is derived to provide it as an acceleration signal in the Y-axis direction. In this case, because the bias magnetic field angle changes along the running direction of the free layers of the spin valve GMR elements 23a-23d and 24a-24d, the first X-axis acceleration signal $V_{X1}$ and the second X-axis acceleration signal $V_{X2}$ and the first Z-axis acceleration signal $V_{Z1}$ and the second Z-axis acceleration signal $V_{Z2}$ are not produced, and therefore, no acceleration signal in the X-axis direction and no acceleration signal in the Z-axis direction are provided.

According to this embodiment, each of the permanent magnets $22a_1$, $22a_2$, $22b_1$, $22b_2$, $22c_1$ and $22c_2$ has the multi-layered structure of three hard magnetic material layers and two nonmagnetic material layers alternately laminated each other in a direction that is perpendicular to the film plane of each of the magnetic field detection sensors 23, 24 and 25 and to the pinned direction of pinned layers of its spin valve GMR elements. Thus, the change, along the pinned direction, in the pinned direction component of the magnetic field that is applied from each permanent magnet is extremely decreased. As a result, high sensitivity and good linearity in detection of acceleration can be expected.

Also, according to this embodiment, because utilized is bending function of the first strip-shaped plate spring 21a with the fulcrum at its center, on the both end sections of which the magnetic field generation members with weights are fixed, and because derived is a differential output between a partial output $V_{X1}$ or $V_{Z1}$ of the first magnetic field detection sensor 23 and a partial output $V_{X2}$ or $V_{Z2}$ of the second magnetic field detection sensor 24, it is possible to certainly separate and correctly derive acceleration components in the X-axis direction and the Z-axis direction. Further, because utilized is twisting function of the first strip-shaped plate spring 21a and appropriately determined is the magnetic field sensing direction of the third magnetic field detection sensor 25, it is possible to certainly separate and correctly derive an acceleration component in the Y-axis direction.

Still further, according to this embodiment, because the first strip-shaped plate spring or main spring 21a and the second strip-shaped plate springs or sub-springs 21b and 21c produce bending stresses together so as to displace them in the bending direction to reach balance, the spring member 21 can be configured to have an extremely small size, a large displacement amount and high sensitivity. Therefore, it is possible to provide an acceleration sensor that can expect highly sensitive detection of acceleration even though having an extremely miniaturized structure.

Further, according to this embodiment, since the four end sections of the spring member are formed in the same structure and shape, it is possible to provide an acceleration sensor with uniform sensitivity and detection directivity of any of the X-axis, Y-axis and Z-axis direction accelerations to be detected.

In addition, because the amount of and the positive and negative of acceleration in each of the Z-axis, X-axis and Y-axis directions can be sensed by only the three magnetic field detection sensors, the number of the magnetic field detection sensors can be decreased and also the structure of each sensor can be extremely simplified resulting the total size of the acceleration sensor to extremely miniaturize. Furthermore, because the spin valve GMR element is quite sensitive in magnetic field change, highly sensitive acceleration detection can be expected.

Further, according to this embodiment, since the bias magnetic fields applied to the pair of spin valve GMR elements in each magnetic field detection sensor are in the directions opposite to each other, the magnetization directions of the respective pinned layers in these spin valve GMR elements are fixed to the same direction. Thus, two pairs of spin valve GMR elements, that is, four spin vale GMR elements can be formed in a single chip resulting the acceleration sensor to more downsize.

According to this embodiment, still further, because the pair of or two permanent magnets provide the closed magnetic loop with widely spread magnetic field in the direction perpendicular to the lamination plane of the spin valve GMR element and the spin valve GMR element is arranged in this closed magnetic loop, only the minimum amount of magnetic field will leaked to the outside from the closed magnetic loop, that is the leakage of magnetic field, will decrease, and enough bias magnetic filed will be applied to the spin valve GMR element. Therefore, even if the permanent magnet downsizes, stable and high sensitivity in acceleration detection can be obtained and also insensitivity to possible external electrical field and external magnetic field applied thereto can be expected.

According to this embodiment, also, because it is not necessary to form electrodes on the spring member and the magnetic field generation members with weights, the wiring structure can be simplified. Also, because of a low impedance, the acceleration sensor of this embodiment is relatively unaffected by external disturbance when compared with the piezo-electric type acceleration sensor and the electrostatic capacitance type acceleration sensor.

Figure 21:
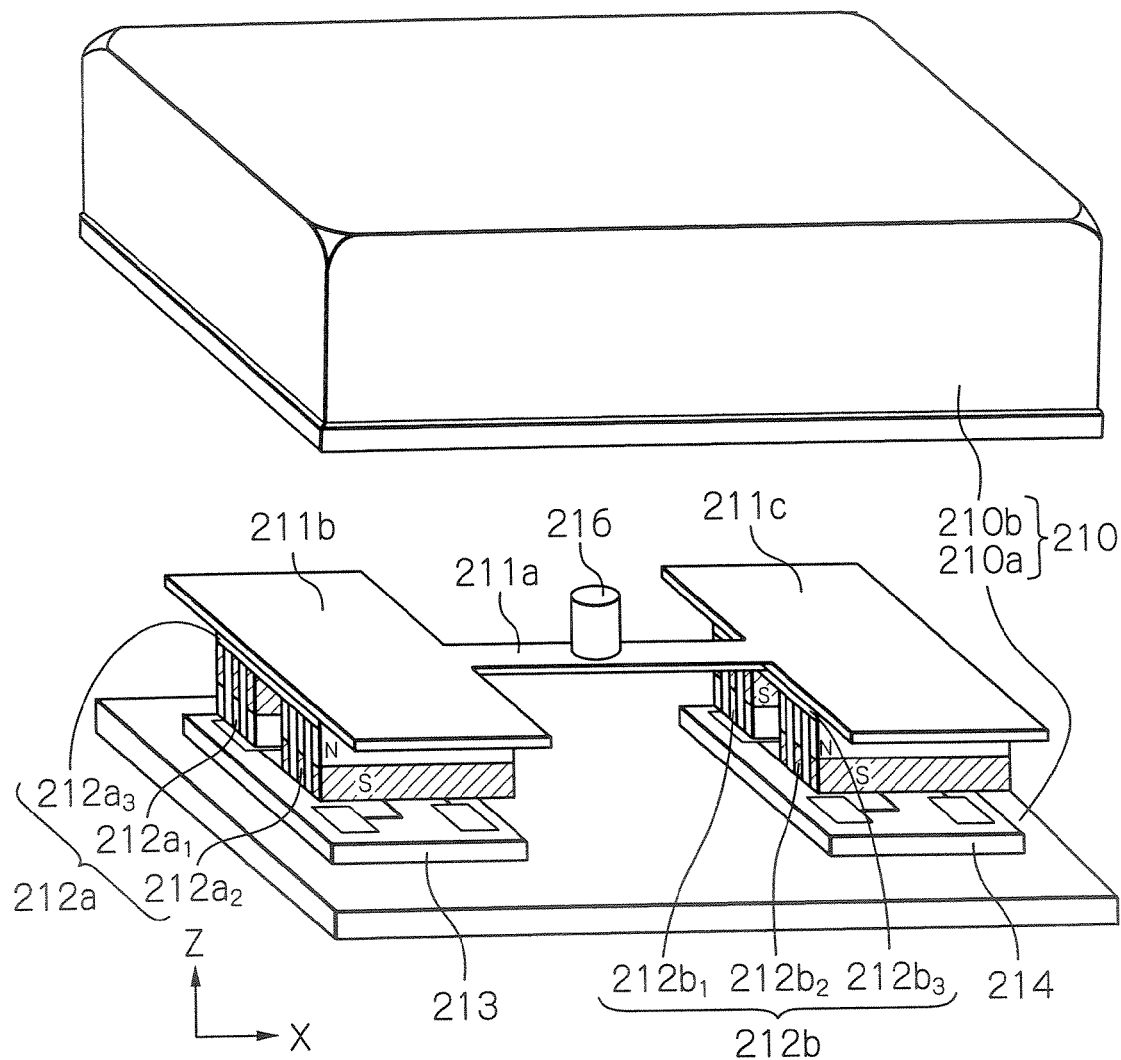
FIG. 21 is an exploded oblique view schematically illustrating a whole structure of an acceleration sensor as another embodiment according to the present invention.
Figure 22:
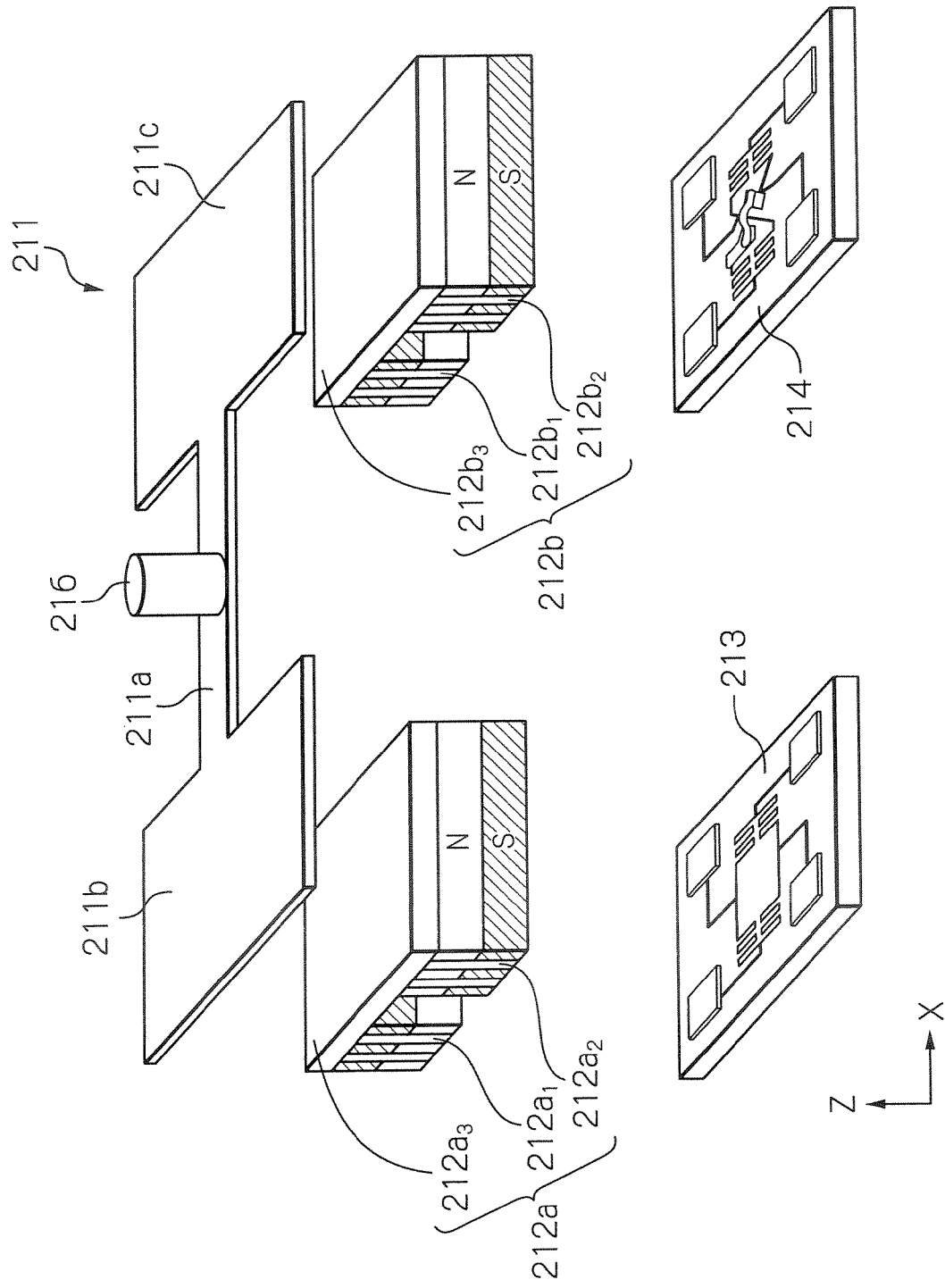
FIG. 22 is an exploded oblique view schematically illustrating structures of a spring member, magnetic field generation members with weights and magnetic filed detection sensors mounted in a housing member of the acceleration sensor shown in FIG. 21.

FIG. 21 schematically illustrates a whole structure of an acceleration sensor as another embodiment according to the present invention, and FIG. 22 illustrates structures of a spring member, magnetic field generation members with weights and magnetic field detection sensors mounted in a housing member of the acceleration sensor.

As shown in these figures, the acceleration sensor in this embodiment is used for detecting accelerations in two axes of X-axis direction and Z-axis, or Y-axis direction and Z-axis direction. In the following description, however, the acceleration sensor is for detecting accelerations in two axes of X-axis direction and Z-axis.

The acceleration sensor has a spring member 211, two magnetic field generation members with weights 212a and 212b, a first magnetic field detection sensor 213 for detecting the X-axis and the Z-axis accelerations, a second magnetic field detection sensor 214 for detecting the X-axis and the Z-axis accelerations, and a fulcrum member 216, accommodated in the housing member 210. The spring member 211 is integrally formed from a strip-shaped plate spring 211a and two weight-support sections 211b and 211c for supporting the two magnetic field generation members with weights 212a and 212b. The two magnetic field generation members with weights 212a and 212b have the same constitutions in dimension, in shape and in weight with each other.

The housing member 210 consists of a flat-shaped wiring board 210a with a substrate made of a resin material such as for example polyimide or BT resin and a wiring pattern (not shown) formed on and in the substrate, and a cover member 210b made of a magnetic metal material for covering and for sealing the wiring board 210a. In this embodiment, accelerations along two axes that are in X-axis direction and Z-axis direction can be detected by the two magnetic field detection sensors 213 and 214 mounted on a single plane of the wiring board 210a.

The spring member 211 is integrally formed from a thin-film metal plate made of for example NiFe, Ni or else, from a thin plate made of for example stainless steel, or from a thin resin plate made of for example polyimide, to have a shape shown in FIG. 22.

The strip-shaped plate spring 211a produces a bending stress in response to an externally applied force. The center of the strip-shaped plate spring 211a constitutes a fulcrum and is fixed to one end of the fulcrum member 216. The other end of the fulcrum member 216 is fixed to the cover member 210b. The both ends of the strip-shaped plate spring 211a are unitarily connected to the weight-support sections 211b and 211c that have the same shape to each other, respectively. In this embodiment, each of the weight-support sections 211b and 211c is shaped in a rectangular. However, in modifications, it may be formed in a circular shape or other shape.

The magnetic field generation members with weights 212a and 212b are fixed by an adhesive on one surfaces, which face to the magnetic field detection sensors, of the weight-support sections 211b and 211c of the spring member 211, respectively. These magnetic field generation members with weights 212a and 212b have two pairs of permanent magnets $212a_1$ and $212a_2$, and $212b_1$ and $212b_2$ for generating magnetic fields, and magnetic material members for connecting these permanent magnets, respectively.

The first magnetic field detection sensor 213 for the X-axis and the Z-axis and the second magnetic field detection sensor 214 for the X-axis and the Z-axis are fixed by an adhesive on the wiring board 210a so as to face the two magnetic field generation members with weights 212a and 212b, respectively. Therefore, magnetic fields with angles that change depending upon the accelerations are applied to the first and second magnetic field detection sensors 213 an 214 from the magnetic field generation members with weights 212a and 212b, respectively.

Figure 23:
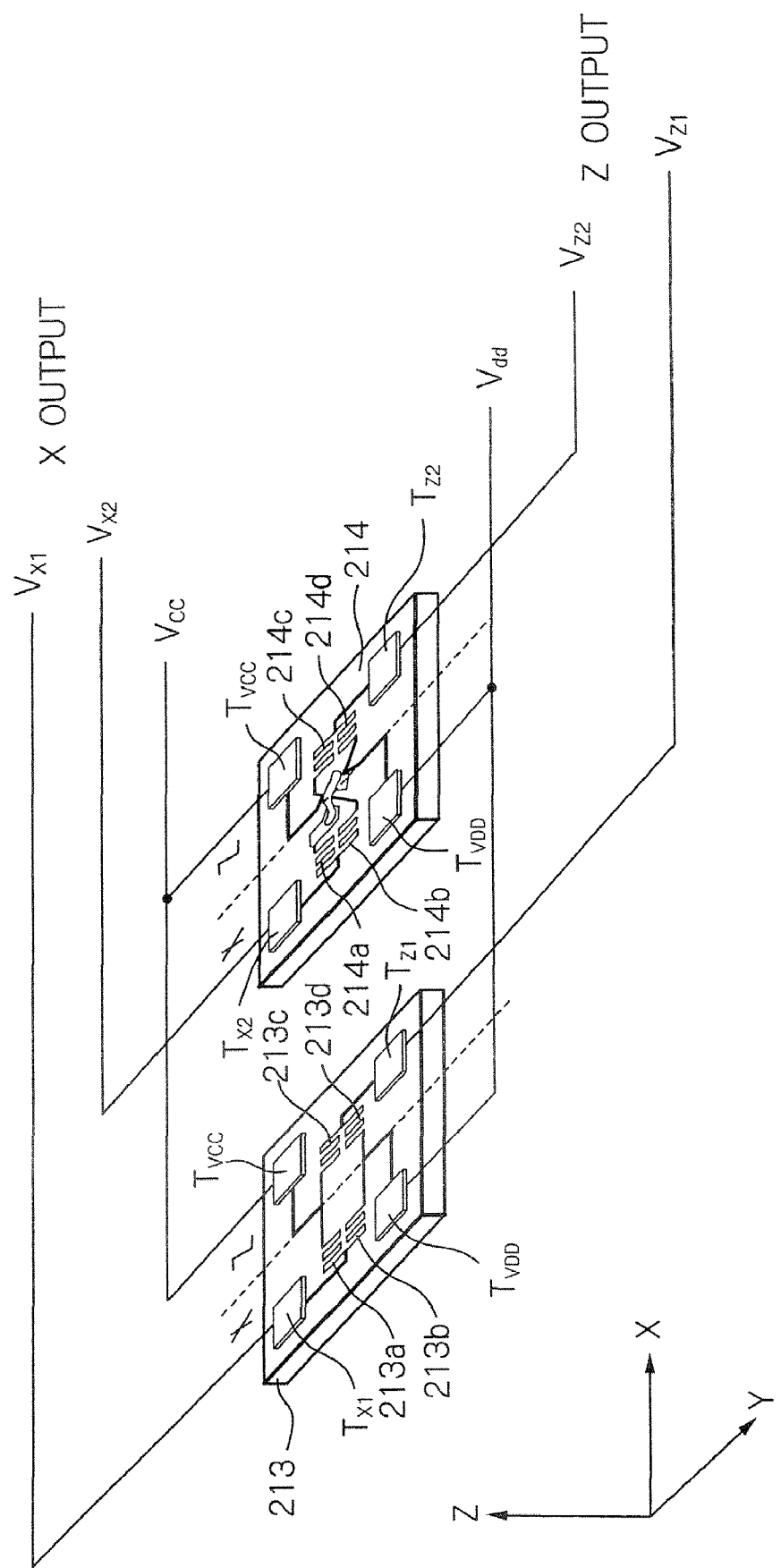
FIG. 23 is a view schematically illustrating electrical connections on a wiring board, and structures of the magnetic filed detection sensors in the acceleration sensor shown in FIG. 21.
Figure 24:
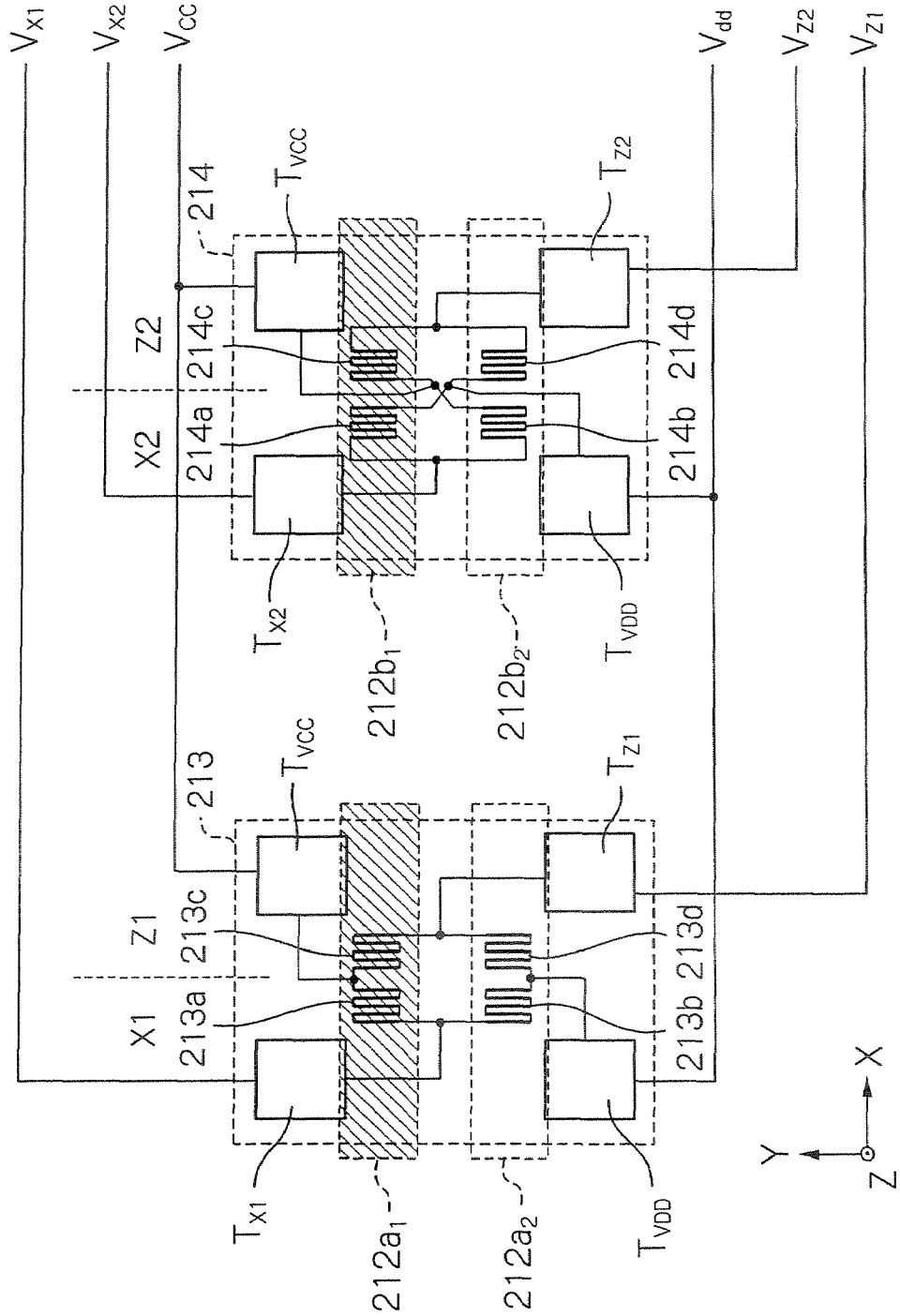
FIG. 24 is a circuit diagram schematically illustrating electrical connection structures of the wiring board and the magnetic filed detection sensors in the acceleration sensor shown in FIG. 21.

Each of the pair of permanent magnets $212a_1$ and $212a_2$ is formed as a multi-layered structure of a ferrite material and a nonmagnetic ceramic material, which structure is the same as that shown in FIG. 12, and shaped in a rectangular parallelepiped shape running in parallel with each other along the X-axis direction. These permanent magnets $212a_1$ and $212a_2$ face to the first magnetic field detection sensor 213 for the X-axis and the Z-axis. The pair of permanent magnets $212a_1$ and $212a_2$ are arranged so that their surfaces facing the first magnetic field detection sensor 213 have different magnetic polarities with each other. The other surfaces of the pair of permanent magnets $212a_1$ and $212a_2$ are magnetically connected each other by a magnetic material member $212a_3$ that constitutes a magnetic return path. A closed magnetic loop is formed by these permanent magnets $212a_1$ and $212a_2$ and the magnetic material member $212a_3$. As will be mentioned later, spin valve GMR elements in the first magnetic field detection sensor 213 are arranged within this closed magnetic loop so that a magnetic field or bias field is applied in a direction substantially perpendicular to the lamination plane of these spin valve GMR elements Particularly, the pair of permanent magnets $212a_1$ and $212a_2$ are arranged such that the longitudinal direction of the respective permanent magnets becomes in parallel with the pinned direction of spin valve GMR elements 213a and 213c and spin valve GMR elements 213b and 213d of a first magnetic field detection sensor 213 (FIGS. 23 and 24). Thus, the change, along the pinned direction, in the pinned direction component of the magnetic field applied from the permanent magnets is decreased. As a result, high sensitivity in detection of acceleration can be attained.

Each of the pair of permanent magnets $212b_1$ and $212b_2$ is formed as a multi-layered structure of a ferrite material and a nonmagnetic ceramic material, which structure is the same as that shown in FIG. 12, and shaped in a rectangular parallelepiped shape running in parallel with each other along the X-axis direction. These permanent magnets $212b_1$ and $212b_2$ face to the second magnetic field detection sensor 214 for the X-axis and the Z-axis. The pair of permanent magnets $212b_1$ and $212b_2$ are arranged so that their surfaces facing the second magnetic field detection sensor 214 have different magnetic polarities with each other. The other surfaces of the pair of permanent magnets $212b_1$ and $212b_2$ are magnetically connected each other by a magnetic material member $212b_3$ that constitutes a magnetic return path. A closed magnetic loop is formed by these permanent magnets $212b_1$ and $212b_2$ and the magnetic material member $212b_3$. As will be mentioned later, spin valve GMR elements in the second magnetic field detection sensor 214 are arranged within this closed magnetic loop so that a magnetic field or bias field is applied in a direction substantially perpendicular to the lamination plane of these spin valve GMR elements. Particularly, the pair of permanent magnets $212b_1$ and $212b_2$ are arranged such that the longitudinal direction of the respective permanent magnets becomes in parallel with the pinned direction of spin valve GMR elements 214a and 214c and spin valve GMR elements 214b and 214d of a second magnetic field detection sensor 214 (FIGS. 23 and 24). Thus, the change, along the pinned direction, in the pinned direction component of the magnetic field applied from the permanent magnets is decreased. As a result, high sensitivity in detection of acceleration can be attained.

Figure 25A:
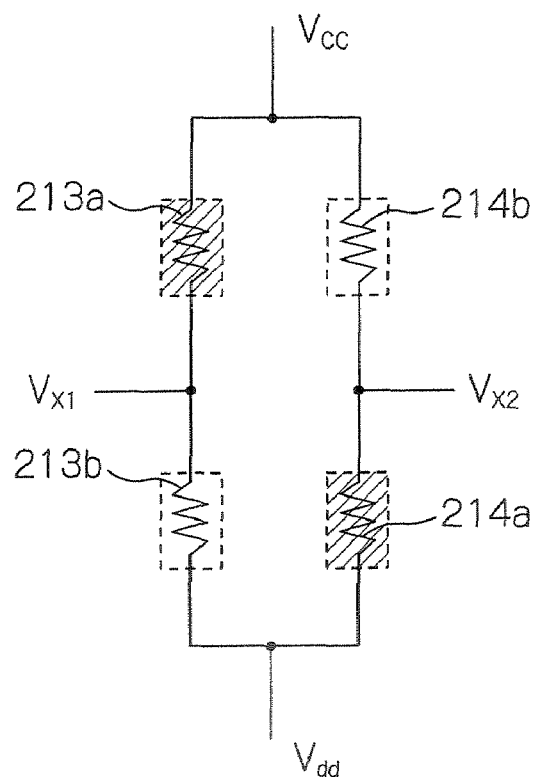
FIGS. 25a and 25b are equivalent circuit diagrams of the acceleration sensor shown in FIG. 21.

FIG. 23 schematically illustrates electrical connections on the wiring board and structures of the magnetic filed detection sensors, FIG. 24 illustrates electrical connection structures of the wiring board and the magnetic filed detection sensors, and FIGS. 25a an 25b show equivalent circuit diagrams of the acceleration sensor.

As illustrated in these figures, in the first magnetic field detection sensor 213 for detecting accelerations in the X-axis and the Z-axis directions, two pairs of or four spin valve GMR elements 213a, 213b, 213c and 213d are formed in parallel with each other. Each of the spin valve GMR elements 213a to 213d has a linear section running along a direction (Y-axis direction) perpendicular to the X-axis. The spin valve GMR elements 213a and 213b constitute one pair and, in this embodiment, they are connected in series with each other. Both ends of the serially connected elements 213a and 213b are electrically connected to power supply terminal electrodes $T_{VCC}$ and $T_{VDD}$, respectively. The central point between the elements 213a and 213b is electrically connected to a signal output terminal $T_{X1}$. The spin valve GMR elements 213c and 213d also constitute one pair and, in this embodiment, they are connected in series with each other. Both ends of the serially connected elements 213c and 213d are electrically connected to the power supply terminal electrodes $T_{VCC}$ and $T_{VDD}$, respectively. The central point between the elements 213c and 213d is electrically connected to a signal output terminal $T_{Z1}$.

Each of the spin valve GMR elements 213a, 213b, 213c and 213d has a multi-layered structure mainly consisting of a magnetization fixed layer constituted by a pin layer of an anti-ferromagnetic material and a pinned layer of a ferromagnetic material, a nonmagnetic space layer, and a magnetization free layer (free layer) of a ferromagnetic material. The magnetization of the pinned layer of each element is fixed in the same direction perpendicular to a running direction of the free layer. Namely, in the first magnetic field detection sensor 213, all the pinned layers of the spin valve GMR elements 213a, 213b, 213c and 213d are fixed in the same direction that is the X-axis direction.

The bias magnetic fields respectively applied to the pair of spin valve GMR elements 213a and 213b connected in series with each other are in the directions substantially opposite to each other. Thus, the magnetization directions of the respective pinned layers in these spin valve GMR elements 213a and 213b are fixed to the same direction. The bias magnetic fields in the directions opposite to each other are obtained because a closed magnetic loop is formed by the pair of permanent magnets $212a_1$ and $212a_2$ and the pair of spin valve GMR elements 213a and 213b are arranged in the respective paths of the closed magnetic loop, through which magnetic fields flow in the directions opposite to each other, as shown in FIG. 24 and as more clearly shown in FIG. 11. In this case, the center of the magnetic circuit that constitutes the closed magnetic loop is located on the centerline between the pair of spin valve GMR elements 213a and 213b.

To the pair of spin valve GMR elements 213c and 213d connected in series with each other, the same bias magnetic fields in the directions substantially opposite to each other are applied and the magnetization directions of the respective pinned layers in these spin valve GMR elements 213c and 213d are fixed to the same direction. In this case, also, the center of the magnetic circuit that constitutes the closed magnetic loop is located on the centerline between the pair of spin valve GMR elements 213c and 213d.

Since the magnetization directions of the respective pinned layers in the pair of spin valve GMR elements 213a and 213b and the pair of spin valve GMR elements 213c and 213d are fixed to the same direction by applying the opposite direction bias magnetic fields thereto, these four spin valve GMR elements 213a, 213b, 213c and 213d can be formed in a single chip resulting the acceleration sensor to more downsize.

In the second magnetic field detection sensor 214 for detecting accelerations in the X-axis and the Z-axis directions, two pairs of or four spin valve GMR elements 214a, 214b, 214c and 214d are also formed in parallel with each other. Each of the spin valve GMR elements 214a to 214d has a linear section running along a direction (Y-axis direction) perpendicular to the X-axis. The spin valve GMR elements 214a and 214b constitute one pair and, in this embodiment, they are connected in series with each other. Both ends of the serially connected elements 214a and 214b are electrically connected to power supply terminal electrodes $T_{VCC}$ and $T_{VDD}$, respectively. The central point between the elements 214a and 214b is electrically connected to a signal output terminal $T_{X2}$. The spin valve GMR elements 214c and 214d also constitute one pair and, in this embodiment, they are connected in series with each other. Both ends of the serially connected elements 214c and 214d are electrically connected to the power supply terminal electrodes $T_{VCC}$ and $T_{VDD}$, respectively. The central point between the elements 214c and 214d is electrically connected to a signal output terminal $T_{Z2}$.

Each of the spin valve GMR elements 214a, 214b, 214c and 214d has a multi-layered structure mainly consisting of a magnetization fixed layer constituted by a pin layer of an anti-ferromagnetic material and a pinned layer of a ferromagnetic material, a nonmagnetic space layer, and a magnetization free layer (free layer) of a ferromagnetic material. The magnetization of the pinned layer of each element is fixed in the same direction perpendicular to a running direction of the free layer. Namely, in the second magnetic field detection sensor 214, all the pinned layers of the spin valve GMR elements 214a, 214b, 214c and 214d are fixed in the same direction that is the X-axis direction.

The bias magnetic fields respectively applied to the pair of spin valve GMR elements 214a and 214b connected in series with each other are in the directions substantially opposite to each other. Thus, the magnetization directions of the respective pinned layers in these spin valve GMR elements 214a and 214b are fixed to the same direction. The bias magnetic fields in the directions opposite to each other are obtained because a closed magnetic loop is formed by the pair of permanent magnets $212b_1$ and $212b_2$ and the pair of spin valve GMR elements 214a and 214b are arranged in the respective paths of the closed magnetic loop, through which magnetic fields flow in the directions opposite to each other, as shown in FIG. 24 and as more clearly shown in FIG. 11. In this case, the center of the magnetic circuit that constitutes the closed magnetic loop is located on the centerline between the pair of spin valve GMR elements 214a and 214b.

To the pair of spin valve GMR elements 214c and 214d connected in series with each other, the same bias magnetic fields in the directions substantially opposite to each other are applied and the magnetization directions of the respective pinned layers in these spin valve GMR elements 214c and 214d are fixed to the same direction. In this case, also, the center of the magnetic circuit that constitutes the closed magnetic loop is located on the centerline between the pair of spin valve GMR elements 214c and 214d.

Since the magnetization directions of the respective pinned layers in the pair of spin valve GMR elements 214a and 214b and the pair of spin valve GMR elements 214c and 214d are fixed to the same direction by applying the opposite direction bias magnetic fields thereto, these four spin valve GMR elements 214a, 214b, 214c and 214d can be formed in a single chip resulting the acceleration sensor to more downsize.

The power supply voltage $V_{CC}$-$V_{DD}$ is applied across the spin valve GMR elements 213a and 213b of the first magnetic field detection sensor 213, and a first X-axis acceleration signal $V_{X1}$ is derived from the signal output terminal $T_{X1}$ connected to the central point there between. Also, the power supply voltage $V_{CC}$-$V_{DD}$ is applied across the spin valve GMR elements 214b and 214a of the second magnetic field detection sensor 214, and a second X-axis acceleration signal $V_{X2}$ is derived from the signal output terminal $T_{X2}$ connected to the central point there between. Therefore, these spin valve GMR elements 213a, 213b, 214b and 214a are connected in full-bridge configuration as shown in FIG. 25a. The signals $V_{X1}$ and $V_{X2}$ from the respective signal output terminals $T_{X1}$ and $T_{X2}$ are differentially amplified to become an acceleration signal in the X-axis direction. This acceleration signal in the X-axis direction is provided only when the magnetic field generation member with weight 212a, that is the permanent magnets $212a_1$ and $212a_2$ and the magnetic material member $212a_3$, and the magnetic field generation member with weight 212b, that is the permanent magnets $212b_1$ and $212b_2$ and the magnetic material member $212b_3$, displace to the opposite directions to each other along the Z-axis direction due to the applied acceleration. When the magnetic field generation members with weights 212a and 212b displace together to the same direction, because the first and second X-axis acceleration signals $V_{X1}$ and $V_{X2}$ cancel each other out, no acceleration signal in the X-axis direction is provided.

Figure 25B:
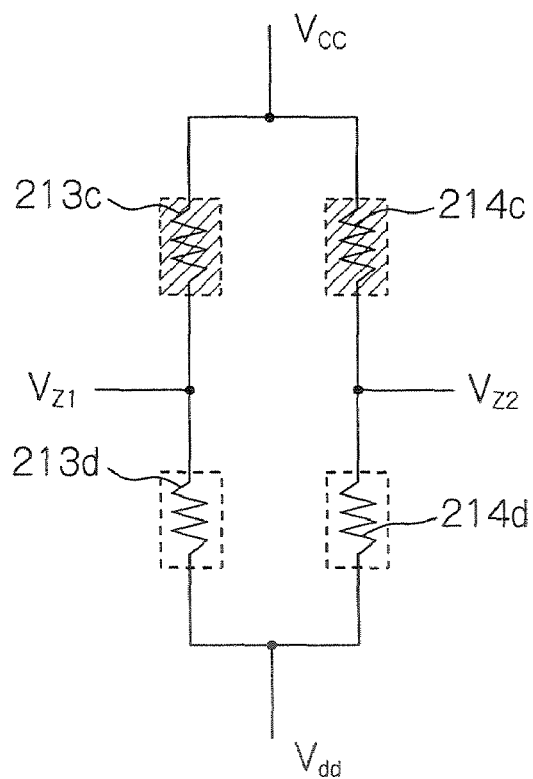

The power supply voltage $V_{CC}$-$V_{DD}$ is applied across the spin valve GMR elements 213c and 213d of the first magnetic field detection sensor 213, and a first Z-axis acceleration signal $V_{Z1}$ is derived from the signal output terminal $T_{Z1}$ connected to the central point there between. Also, the power supply voltage $V_{CC}$-$V_{DD}$ is applied across the spin valve GMR elements 214c and 214d of the second magnetic field detection sensor 214, and a second Z-axis acceleration signal $V_{Z2}$ is derived from the signal output terminal $T_{Z2}$ connected to the central point there between. Therefore, these spin valve GMR elements 213c, 213d, 214c and 214d are connected in full-bridge configuration as shown in FIG. 25b. The signals $V_{Z1}$ and $V_{Z2}$ from the respective signal output terminals $T_{Z1}$ and $T_{Z2}$ are differentially amplified to become an acceleration signal in the Z-axis direction. This acceleration signal in the Z-axis direction is provided only when the magnetic field generation member with weight 212a, that is the permanent magnets $212a_1$ and $212a_2$ and the magnetic material member $212a_3$, and the magnetic field generation member with weight 212b, that is the permanent magnets $212b_1$ and $212b_2$ and the magnetic material member $212b_3$, displace together to the same direction along the Z-axis direction due to the applied acceleration. When the magnetic field generation members with weights 212a and 212b displace to the opposite directions to each other, because the first and second Z-axis acceleration signals $V_{Z1}$ and $V_{Z2}$ cancel each other out, no acceleration signal in the Z-axis direction is provided.

According to this embodiment, each of the permanent magnets has the multi-layered structure of three hard magnetic material layers and two nonmagnetic material layers alternately laminated each other in a direction that is perpendicular to the film plane of each of the magnetic field detection sensor and to the pinned direction of pinned layers of its spin valve GMR elements as described with reference to FIG. 12. Thus, the change, along the pinned direction, in the pinned direction component of the magnetic field that is applied from each pair of permanent magnets is decreased. As a result, high sensitivity and good linearity in detection of acceleration can be attained.

Hereinafter, structures and operations of the spring member 211 of this embodiment will be described in detail.

FIGS. 26a, 26b and 26c illustrate operations of the spring member in this embodiment.

FIG. 26a shows a state where no external force is applied and thus no displacement occurs. When an external force $F_X$ along the X-axis direction is applied as shown in FIG. 26b, the strip-shaped plate spring 211a produces bending stresses to displace the magnetic field generation members with weights 212a and 212b in the bending direction to reach balance. In this case, the displaced directions of the both ends of the strip-shaped plate spring 211a and the magnetic field generation members with weights 212a and 212b are opposite directions each other. When an external force $F_Z$ along the Z-axis direction is applied as shown in FIG. 26c, the strip-shaped plate spring or main spring 211a produces bending stresses to displace the magnetic field generation members with weights 212a and 212b in the bending direction to reach balance. In this case, the displaced directions of the both ends of the strip-shaped plate spring 211a and the magnetic field generation members with weights 212a and 212b are the same direction. The displacement amounts of the magnetic field generation members with weights 212a and 212b are proportional to displacement angles θ of the magnetic field generation members with weights 212a and 212b. In case that the angles of the magnetic field generation members with weights thus change, the spin valve GMR elements can detect the displacement angles to know the applied external force. An external force $F_X$ along the X-axis direction is given from $F_X = \theta_{X1} - \theta_{X2}$, where $\theta_{X1}$ and $\theta_{X2}$ are displacement angles of the magnetic field generation members with weights 212a and 212b when the external force $F_X$ is applied. An external force $F_Z$ along the Z-axis direction is given from $F_Z = \theta_{Z1} + \theta_{Z2}$, where $\theta_{Z1}$ and $\theta_{Z2}$ are displacement angles of the magnetic field generation members with weights 212a and 212b when the external force $F_Z$ is applied.

When the external force $F_X$ along the X-axis direction is applied and the magnetic field generation members with weights 212a and 212c displace in the bending direction as aforementioned, angles of the bias magnetic fields applied to the spin valve GMR elements 213a and 213b and the spin valve GMR elements 214b and 214a accordingly change to the same direction. Thus, an added differential output of the first X-axis acceleration signal $V_{X1}$ and the second X-axis acceleration signal $V_{X2}$ is derived to provide it as an acceleration signal in the X-axis direction. In this case, since the first Z-axis acceleration signal $V_{Z1}$ and the second Z-axis acceleration signal $V_{Z2}$ cancel each other out, no acceleration signal in the Z-axis direction is provided.

When the external force $F_Z$ along the Z-axis direction is applied and the magnetic field generation members with weights 212a and 212c displace in the bending direction as aforementioned, angles of the bias magnetic fields applied to the spin valve GMR elements 213c and 213d and the spin valve GMR elements 214c and 214d accordingly change to the opposite directions. Thus, an added differential output of the first Z-axis acceleration signal $V_{Z1}$ and the second Z-axis acceleration signal $V_{Z2}$ is derived to provide it as an acceleration signal in the Z-axis direction. In this case, since the first X-axis acceleration signal $V_{X1}$ and the second X-axis acceleration signal $V_{X2}$ cancel each other out, no acceleration signal in the X-axis direction is provided.

As above-mentioned, according to this embodiment, each of the permanent magnets $212a_1$, $212a_2$, $212b_1$ and $212b_2$ has the multi-layered structure of three hard magnetic material layers and two nonmagnetic material layers alternately laminated each other in a direction that is perpendicular to the film plane of each of the magnetic field detection sensors 213 and 214 and to the pinned direction of pinned layers of its spin valve GMR elements. Thus, the change, along the pinned direction, in the pinned direction component of the magnetic field that is applied from each permanent magnet is decreased. As a result, high sensitivity and good linearity in detection of acceleration can be attained.

Also, according to this embodiment, because utilized is bending function of the first strip-shaped plate spring 211a with the fulcrum at its center, on the both end sections of which the magnetic field generation members with weights are fixed, and because derived is a differential output between a partial output $V_{X1}$ or $V_{Z1}$ of the first magnetic field detection sensor 213 and a partial output $V_{X2}$ or $V_{Z2}$ of the second magnetic field detection sensor 214, it is possible to certainly separate and correctly derive acceleration components in the X-axis direction and the Z-axis direction.

Further, according to this embodiment, because the strip-shaped plate spring 211a produces bending stress so as to displace it in the bending direction to reach balance, the spring member 211 can be configured to have an extremely small size, a large displacement amount and high sensitivity. Therefore, it is possible to provide an acceleration sensor that can expect highly sensitive detection of acceleration even though having an extremely miniaturized structure.

Still further, according to this embodiment, since the two end sections of the spring member are formed in the same structure and shape, it is possible to provide an acceleration sensor with uniform sensitivity and detection directivity of any of the X-axis and Z-axis, or Y-axis and Z-axis direction accelerations to be detected.

Also, because the amount of and the positive and negative of acceleration in each of the Z-axis and X-axis directions can be sensed by only the two magnetic field detection sensors, the number of the magnetic field detection sensors can be decreased and also the structure of each sensor can be extremely simplified resulting the total size of the acceleration sensor to extremely miniaturize Furthermore, because the spin valve GMR element is quite sensitive in magnetic field change, highly sensitive acceleration detection can be expected.

Further, according to this embodiment, since the bias magnetic fields applied to the pair of spin valve GMR elements in each magnetic field detection sensor are in the directions opposite to each other, the magnetization directions of the respective pinned layers in these spin valve GMR elements are fixed to the same direction. Thus, two pairs of spin valve GMR elements, that is, four spin vale GMR elements can be formed in a single chip resulting the acceleration sensor to more downsize.

According to this embodiment, still further, because the pair of or two permanent magnets provide the closed magnetic loop with widely spread magnetic field in the direction perpendicular to the lamination plane of the spin valve GMR element and the spin valve GMR element is arranged in this closed magnetic loop, only the minimum amount of magnetic field will leaked to the outside from the closed magnetic loop, that is the leakage of magnetic field, will decrease, and enough bias magnetic filed will be applied to the spin valve GMR element. Therefore, even if the permanent magnet downsizes, stable and high sensitivity in acceleration detection can be obtained and also insensitivity to possible external electrical field and external magnetic field applied thereto can be expected.

According to this embodiment, further, because it is not necessary to form electrodes on the spring member and the magnetic field generation members with weights, the wiring structure can be simplified. Also, because of a low impedance, the acceleration sensor of this embodiment is relatively unaffected by external disturbance when compared with the piezo-electric type acceleration sensor and the electrostatic capacitance type acceleration sensor.

In the aforementioned embodiment, the closed magnetic loop is formed by two permanent magnets with opposite magnetic polarities to each other on their surfaces that face the magnetic filed detection sensor. However, such closed magnetic field can be formed by combining a single permanent magnet with a yoke made of for example a soft magnetic material.

In the aforementioned embodiments and modifications, the acceleration sensor is formed from the full-bridge configuration of the spin valve GMR elements. However, according to the present invention, acceleration sensor can be formed from a half-bridge configuration wherein a part of the spin valve GMR sensors is replaced from simple resistors or constant current sources.

As for the magnetic field detection element, a TMR element may be used instead of the spin valve GMR element.

The acceleration sensor according to the present invention can be adapted to any devices for detecting acceleration(s) other than the magnetic disk drive apparatus as the aforementioned embodiments.

Many widely different embodiments of the present invention may be constructed without departing from the spirit and scope of the present invention. It should be understood that the present invention is not limited to the specific embodiments described in the specification, except as defined in the appended claims.

The invention claimed is:

1. An acceleration sensor comprising:
   at least one permanent magnet;
   a spring member for supporting said at least one permanent magnet to displace the at least one permanent magnet when an external force is applied; and
   a magnetic field detection sensor mounted in stationary state to face said at least one permanent magnet,
   said magnetic field detection sensor having at least one multi-layered magnetoresistive effect element that includes a magnetization fixed layer and a magnetization free layer, said magnetization fixed layer being magnetized in a direction parallel to a displacement detection direction,
   said at least one permanent magnet having a multi-layered structure of hard magnetic material layers and nonmagnetic material layers alternately laminated each other in a direction perpendicular to a plane of said magnetic field detection sensor and to the magnetized direction of said magnetization fixed layer.

2. The acceleration sensor as claimed in claim 1, wherein said at least one permanent magnet comprises a pair of permanent magnets,
   wherein each of said pair of permanent magnets has a first surface facing said magnetic field detection sensor, and
   wherein said pair of permanent magnets are arranged in parallel so that said first surfaces of the pair of permanent magnets have different magnetic polarities with each other.

3. The acceleration sensor as claimed in claim 1, wherein said at least one permanent magnet comprises a pair of permanent magnets,
   wherein each of said pair of permanent magnets has a first surface facing said magnetic field detection sensor and a second surface opposite to said first surface, and
   wherein said second surfaces of said pair of permanent magnets are connected to each other by a magnetic material member.

4. The acceleration sensor as claimed in claim 1, wherein said hard magnetic material layers of said at least one permanent magnet are made of a ferrite material.

5. The acceleration sensor as claimed in claim 1, wherein said nonmagnetic material layers of said at least one permanent magnet are made of a nonmagnetic ceramic material.

6. The acceleration sensor as claimed in claim 1, wherein said at least one multi-layered magnetoresistive effect element comprises a linear portion running along a direction perpendicular to the magnetized direction of said magnetization fixed layer, and a plurality of multi-layered magnetoresistive effect layers connected in series, each multi-layered magnetoresistive effect layer having said magnetization fixed layer and said magnetization free layer.

7. The acceleration sensor as claimed in claim 1, wherein said spring member comprises at least one strip-shaped plate spring with a fulcrum and a support section separated from said fulcrum for supporting said at least one permanent magnet, said at least one strip-shaped plate spring being configured to produce a bending stress in response to the external force applied so as to displace said at least one permanent magnet.

8. The acceleration sensor as claimed in claim 1, wherein said spring member comprises a first strip-shaped plate spring with a fulcrum located at a center of the first strip-shaped plate spring and two second strip-shaped plate springs having fulcrums located at a center of each of the two second strip-shaped plate springs connected both ends of said first strip-shaped plate spring respectively, and wherein said at least one permanent magnet is attached to each end of each second strip-shaped plate spring.

9. The acceleration sensor as claimed in claim 1, wherein said spring member comprises a single strip-shaped plate spring having a fulcrum located at a center of the first strip-shaped plate spring, and
   wherein said at least one permanent magnet is attached to each end of said single strip-shaped plate spring.

10. The acceleration sensor as claimed in claim 1, wherein the at least one multi-layered magnetoresistive effect element consists of a giant magnetoresistive effect element or a tunnel magnetoresistive effect element.

11. A magnetic disk drive apparatus with an acceleration sensor, said acceleration sensor comprising:
    at least one permanent magnet;
    a spring member for supporting said at least one permanent magnet to displace the at least one permanent magnet when an external force is applied; and
    a magnetic field detection sensor mounted in stationary state to face said at least one permanent magnet,
    said magnetic field detection sensor having at least one multi-layered magnetoresistive effect element that includes a magnetization fixed layer and a magnetization free layer, said magnetization fixed layer being magnetized in a direction parallel to a displacement detection direction,
    said at least one permanent magnet having a multi-layered structure of hard magnetic material layers and nonmagnetic material layers alternately laminated each other in a direction perpendicular to a plane of said magnetic field detection sensor and to the magnetized direction of said magnetization fixed layer.

12. The magnetic disk drive apparatus as claimed in claim 11, wherein said at least one permanent magnet comprises a pair of permanent magnets, wherein each of said pair of permanent magnets has a first surface facing said magnetic field detection sensor, and wherein said pair of permanent magnets are arranged in parallel so that said first surfaces of the pair of permanent magnets have different magnetic polarities with each other.

13. The magnetic disk drive apparatus as claimed in claim 11, wherein said at least one permanent magnet comprises a pair of permanent magnets, wherein each of said pair of permanent magnets has a first surface facing said magnetic field detection sensor and a second surface opposite to said first surface, and wherein said second surfaces of said pair of permanent magnets are connected to each other by a magnetic material member.

14. The magnetic disk drive apparatus as claimed in claim 11, wherein said hard magnetic material layers of said at least one permanent magnet are made of a ferrite material.

15. The magnetic disk drive apparatus as claimed in claim 11, wherein said nonmagnetic material layers of said at least one permanent magnet are made of a nonmagnetic ceramic material.

16. The magnetic disk drive apparatus as claimed in claim 11, wherein said at least one multi-layered magnetoresistive effect element comprises a linear portion running along a direction perpendicular to the magnetized direction of said magnetization fixed layer, and a plurality of multi-layered magnetoresistive effect layers connected in series, each multi-layered magnetoresistive effect layer having said magnetization fixed layer and said magnetization free layer.

17. The magnetic disk drive apparatus as claimed in claim 11, wherein said spring member comprises at least one strip-shaped plate spring with a fulcrum and a support section separated from said fulcrum for supporting said at least one permanent magnet, said at least one strip-shaped plate spring being configured to produce a bending stress in response to the external force applied so as to displace said at least one permanent magnet.

18. The magnetic disk drive apparatus as claimed in claim 11, wherein said spring member comprises a first strip-shaped plate spring with a fulcrum located at a center of the first strip-shaped plate spring and two second strip-shaped plate springs having fulcrums located at a center of each of the two second strip-shaped plate springs connected both ends of said first strip-shaped plate spring respectively, and wherein said at least one permanent magnet is attached to each end of each second strip-shaped plate spring.

19. The magnetic disk drive apparatus as claimed in claim 11, wherein said spring member comprises a single strip-shaped plate spring having a fulcrum located at a center of the first strip-shaped plate spring, and
wherein said at least one permanent magnet is attached to each end of said single strip-shaped plate spring.

20. The magnetic disk drive apparatus as claimed in claim 11, wherein the at least one multi-layered magnetoresistive effect element consists of a giant magnetoresistive effect element or a tunnel magnetoresistive effect element.

* * * * *